US012721138B2

(12) United States Patent
Wen et al.

(10) Patent No.: US 12,721,138 B2
(45) Date of Patent: Aug. 25, 2026

(54) SEMICONDUCTOR STRUCTURES WITH THROUGH VIA

(71) Applicant: Taiwan Semiconductor Manufacturing Company, Ltd., Hsin-Chu (TW)

(72) Inventors: Ke-Gang Wen, Hsinchu County (TW); Kuan-Hsun Wang, Hsinchu City (TW); Tsung-Chieh Hsiao, Changhua County (TW); Liang-Wei Wang, Hsinchu City (TW); Dian-Hau Chen, Hsinchu (TW); Hsin-Feng Chen, Yilan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 452 days.

(21) Appl. No.: 18/512,816

(22) Filed: Nov. 17, 2023

(65) Prior Publication Data

US 2025/0167077 A1 May 22, 2025

(51) Int. Cl.
*H10W 20/20* (2026.01)
*H10W 20/40* (2026.01)
(Continued)

(52) U.S. Cl.
CPC ......... *H10W 20/20* (2026.01); *H10W 20/212* (2026.01); *H10W 20/2125* (2026.01);
(Continued)

(58) Field of Classification Search
CPC H10W 20/20; H10W 20/212; H10W 20/2125
See application file for complete search history.

(56) References Cited

U.S. PATENT DOCUMENTS 6,252,266 B1 * 6/2001 Hoshi .................. H10D 64/251 257/E29.127
8,802,504 B1 8/2014 Hou et al.
(Continued)

FOREIGN PATENT DOCUMENTS

TW 202238839 A 10/2022

OTHER PUBLICATIONS

Yang et al., "Through Via With Guard Ring Structure," U.S. Appl. No. 18/304,527, filed Apr. 21, 2023, Assignee: Taiwan Semiconductor Manufacturing Company, Ltd., 30 pages specification, 22 pages drawings.

*Primary Examiner* — Jose R Diaz
(74) *Attorney, Agent, or Firm* — HAYNES AND BOONE, LLP

(57) ABSTRACT

A semiconductor structure includes a substrate, a device layer over the substrate, an interconnect structure over the device layer, and a first plurality of through vias and a second plurality of through vias extending through the substrate, the device layer, and the interconnect structure. The device layer includes first and second device regions. From a top view, the first device region has a first side facing and spaced apart from a second side of the second device region. From the top view, the first plurality of through vias are disposed along a third side of the first device region opposite to the first side of the first device region, the second plurality of through vias are disposed along a fourth side of the second device region opposite to the second side of the second device region. Each through via has a racetrack shape from the top view.

20 Claims, 15 Drawing Sheets

(51) Int. Cl.

| | |
|---|---|
| ***H10W 20/41*** | (2026.01) |
| ***H10W 72/90*** | (2026.01) |
| ***H10W 90/00*** | (2026.01) |
| ***H10W 90/20*** | (2026.01) |

(52) U.S. Cl.

CPC ....... *H10W 20/2134* (2026.01); *H10W 20/40* (2026.01); *H10W 20/41* (2026.01); *H10W 90/00* (2026.01); *H10W 72/952* (2026.01); *H10W 90/297* (2026.01); *H10W 90/722* (2026.01)

(56) References Cited

U.S. PATENT DOCUMENTS

| | | | | |
|---|---|---|---|---|
| 8,803,292 | B2 | 8/2014 | Chen et al. | |
| 8,803,316 | B2 | 8/2014 | Lin et al. | |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 2008/0073747 | A1* | 3/2008 | Chao ..................... | H10W 90/00 257/E21.628 |
| 2020/0118922 | A1 | 4/2020 | Hill | |
| 2022/0044986 | A1 | 2/2022 | Khalil et al. | |
| 2022/0277998 | A1 | 9/2022 | Kao et al. | |
| 2023/0170281 | A1 | 6/2023 | Fujiwara et al. | |
| 2025/0015150 | A1* | 1/2025 | Kawashima ......... | H10D 64/254 |

* cited by examiner

B—B

SEMICONDUCTOR STRUCTURES WITH THROUGH VIA

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

More recent attempts have focused on through vias, e.g., through-silicon or through-substrate vias (TSVs). TSVs have found applications in three-dimensional (3D) ICs for transferring power and/or electrical signal from one side of a silicon substrate of an IC to the other side thereof. Generally, a TSV is formed by etching a vertical via opening through a substrate and filling the via opening with a conductive material, such as copper. If regions used by TSVs occupy a significant portion of the entire space available to manufacture an IC, scaling capability will be limited. On the other hand, smaller TSVs may have increased resistance and would consume extra power. Thus, while existing TSVs are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
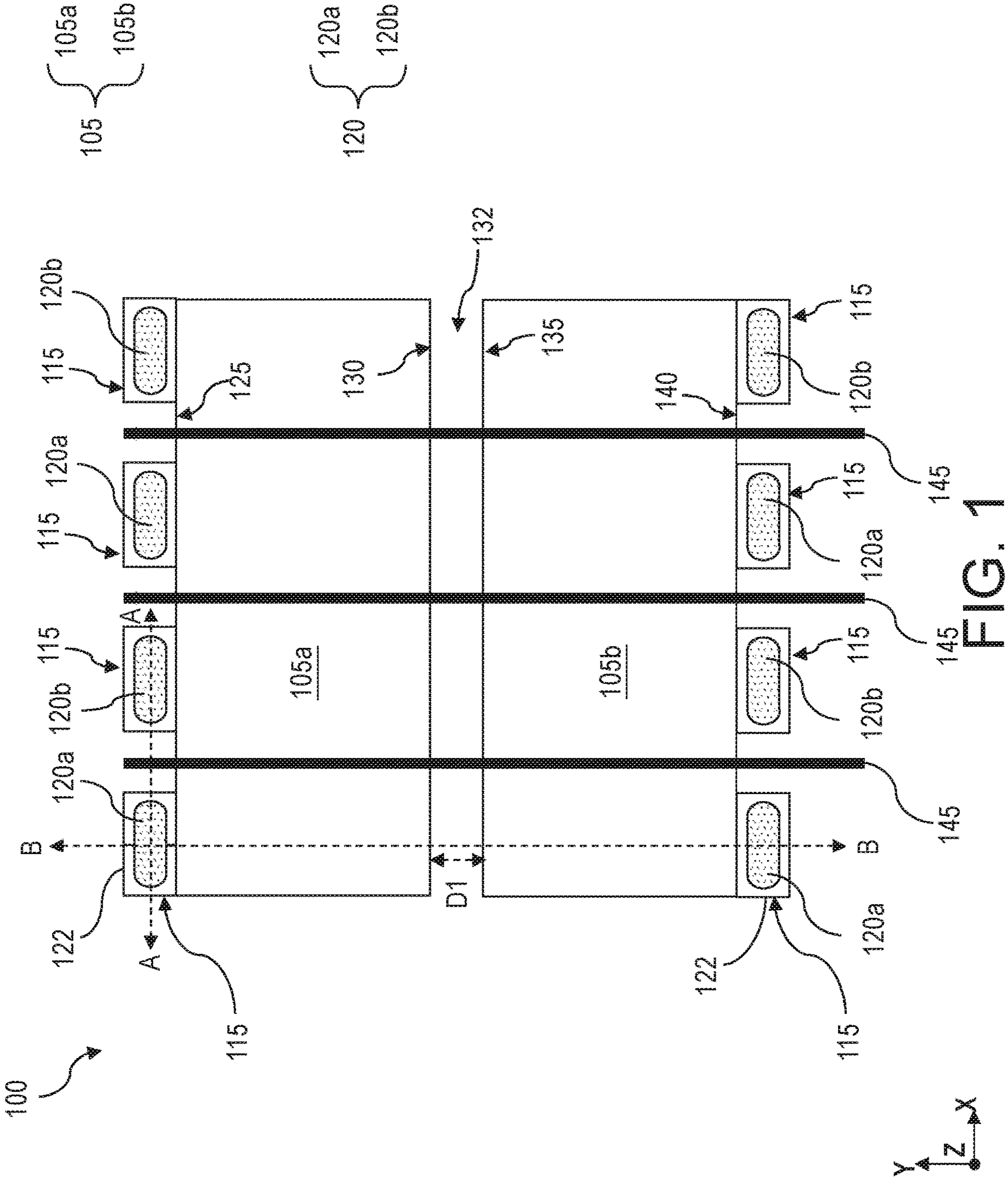
FIG. 1 is a diagrammatic top view of a portion of a semiconductor structure according to various aspects of the present disclosure.

The present disclosure relates generally to semiconductor structures, and more particularly, to through vias of semiconductor structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An interconnect structure electrically couples various components (for example, transistors, resistors, capacitors, and/or inductors) fabricated on a substrate, such that the various components can operate as specified by design requirements. An interconnect structure includes a combination of dielectric layers and conductive layers configured to provide electrical signal routing. The conductive layers include via and contact features that provide vertical connections and conductive lines that provide horizontal connections. In some implementations, an interconnect structure may have multiple metal layers (or metallization layers) that are vertically interconnected by via or contact features. During operation of the IC device, the interconnect structure routes signals among the components of the IC device and/or distribute signals (for example, clock signals, voltage signals, and/or ground signals) to the components. An interconnect structure is formed in a back-end-of-the-line (BEOL) process, typically formed after the front-end-of-the-line (FEOL) process forms the active devices such as a transistor on a substrate and the middle-end-of-the-line (MEOL) process forms source/drain contact plugs and gate contact plugs.

In some implementations, there is a need to provide a vertical interconnect that extends through the interconnect structure and/or the substrate of IC devices. Such a vertical interconnect may be referred to as a through via, a through-silicon via (TSV), or a through-substrate via (TSV) as it extends through a semiconductor die. The term TSV in the present disclosure broadly encompasses via structures that provide direct routing between a frontside of a die and a backside of the die or vice versa.

TSVs can provide an electrical connection that presents an alternative to other interconnect techniques (e.g., wire bond). In some implementations, TSVs allow for fabricating 3D packages or integrated circuits, providing for devices on different substrates to be interconnected. TSVs can provide for an interconnection that is robust, provides higher device density, and a shorter interconnection path. The introduction of TSVs can provide for device performance improvements such as a reduction in RC delay. The semiconductor devices suitable for TSVs including those of the present disclosure are various and include, but are not limited to, image sensors such as CMOS image sensors (CISs), 3D packages, 3D ICs, an integrated-fan-out (InFO) package, a chip-on-wafer-on-substrate (CoWoS) package, a system on integrated chip (SoIC) package, a three-dimensional integrated circuit (3DIC) package, a system-on-chip (SoC) package, MEMS devices, radio frequency (RF) devices, wafer-on-wafer (WoW) devices, and the like.

During the formation of TSVs, moisture may erode metal materials in regions accommodating TSVs. Guard rings have been developed as structural barriers surrounding TSVs to prevent moisture from attacking metal materials in these regions. Further, guard rings may also provide electrical barriers to protect nearby components from electrical interference from current carrying through TSVs.

TSVs may be located in a TSV region close to a device region. If the TSV regions occupy a significant portion of the entire space available to manufacture an IC, scaling capability will be limited. On the other hand, smaller TSVs that require smaller TSV regions may cause increased resistance of TSVs and would consume extra power.

The present disclosure provides a semiconductor structure including TSVs having elongated shapes (e.g., racetrack shapes) from a top view. In some implementations, the semiconductor structure includes a device layer and an interconnect structure over the device layer. The device layer includes a first device region and a second device region adjacent to the first device region. The TSVs extend through the device layer and the interconnect structure. The TSVs may be arranged along one side of each of the first device region and the second device region. The TSVs may have increased area from the top view, thus have reduced resistance and wasted energy during operation, and may reduce the number of TSVs needed in the semiconductor structure. In some embodiments, space between the first device region and the second device region may be free of TSVs, thus the space may be reduced, and footprint of the semiconductor structure may be reduced. In some embodiments, the TSVs also provide flexibility to a height of the TSVs, so that a thickness of the semiconductor structure may be reduced.

Figure 2:
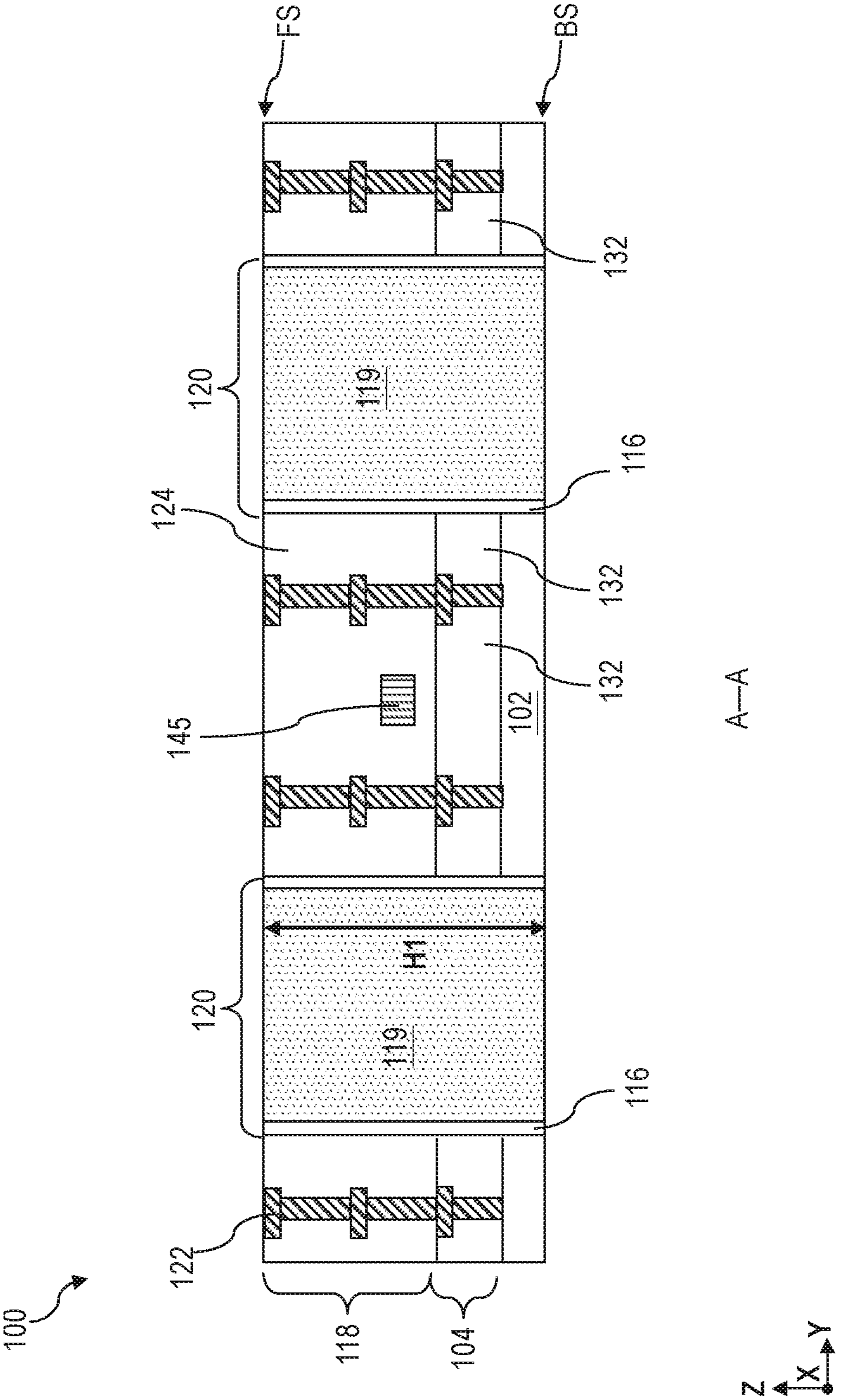
FIGS. 2 and 3 are diagrammatic cross-sectional views of a portion of the semiconductor structure of FIG. 1 along an A-A line and along a B-B line, respectively, according to various aspects of the present disclosure.
Figure 3:
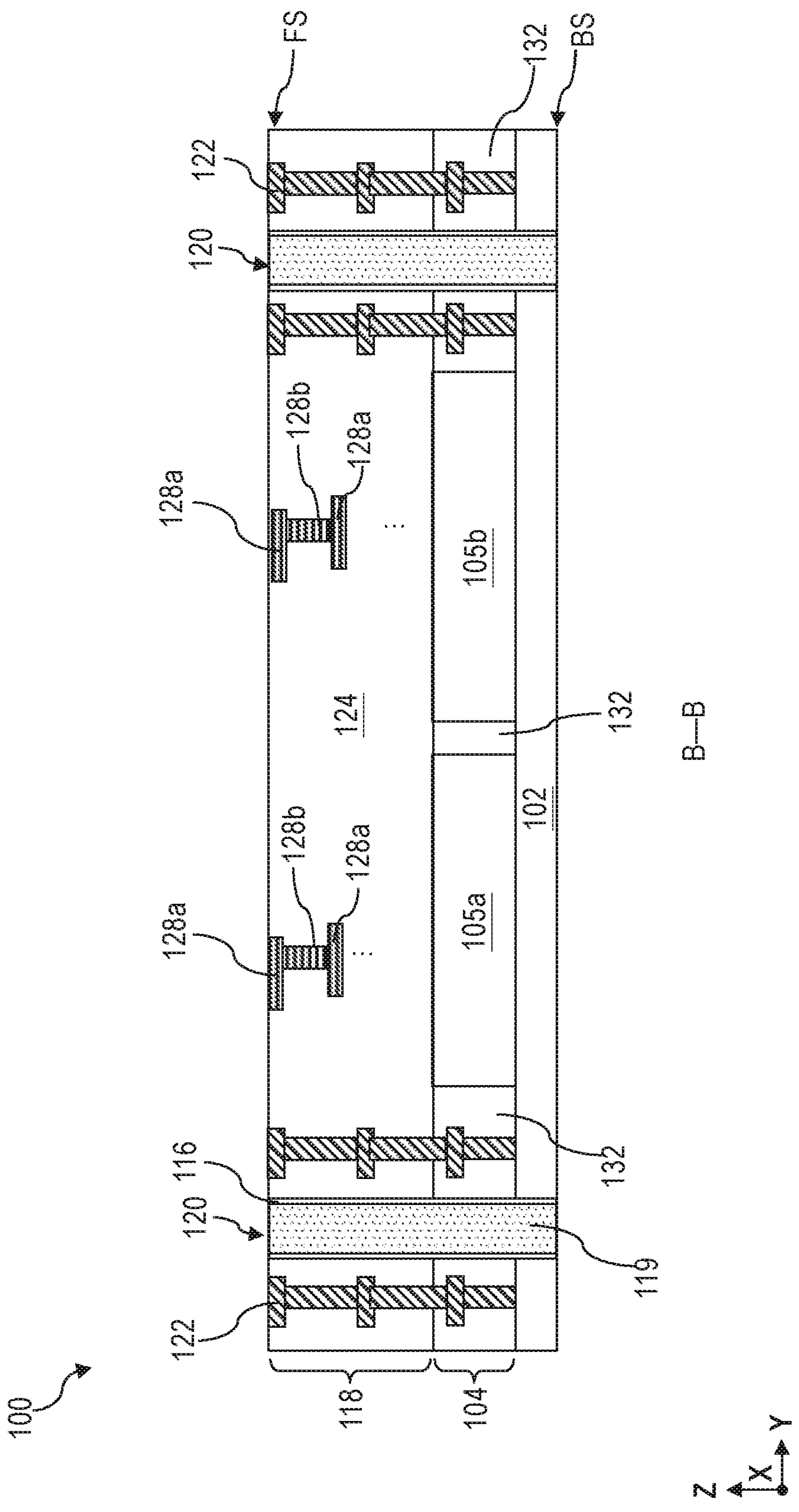
Figure 4B:
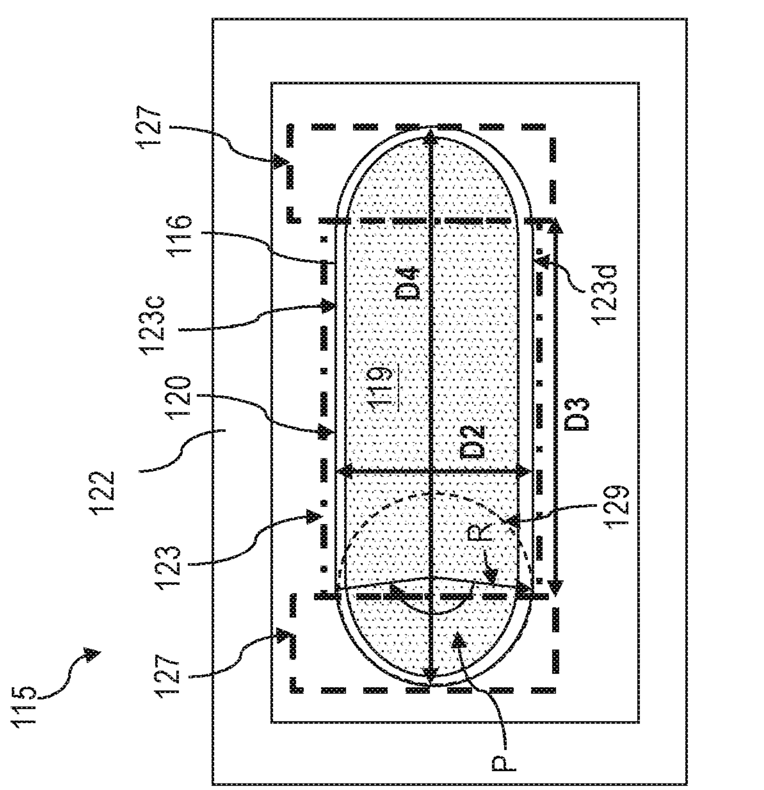
FIGS. 4B, 4C, and 4D are diagrammatic top views of a through via structure of FIG. 1 according to alternative embodiments of the present disclosure.
Figure 4A:
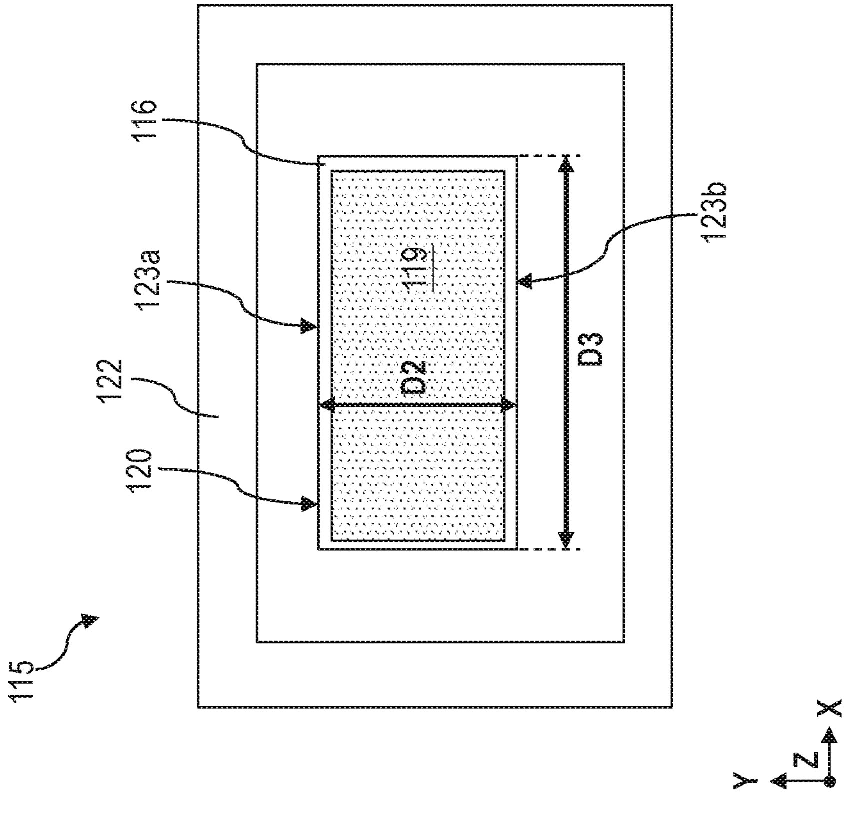
FIG. 4A is a diagrammatic top view of a through via structure of FIG. 1 according to various aspects of the present disclosure.
Figure 4C:
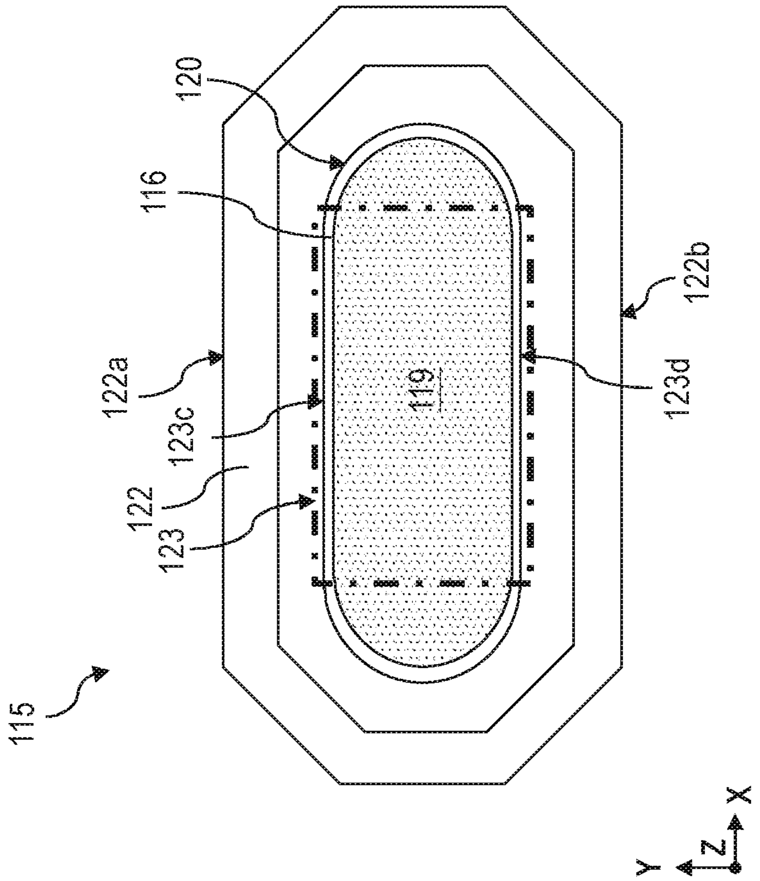
Figure 4D:
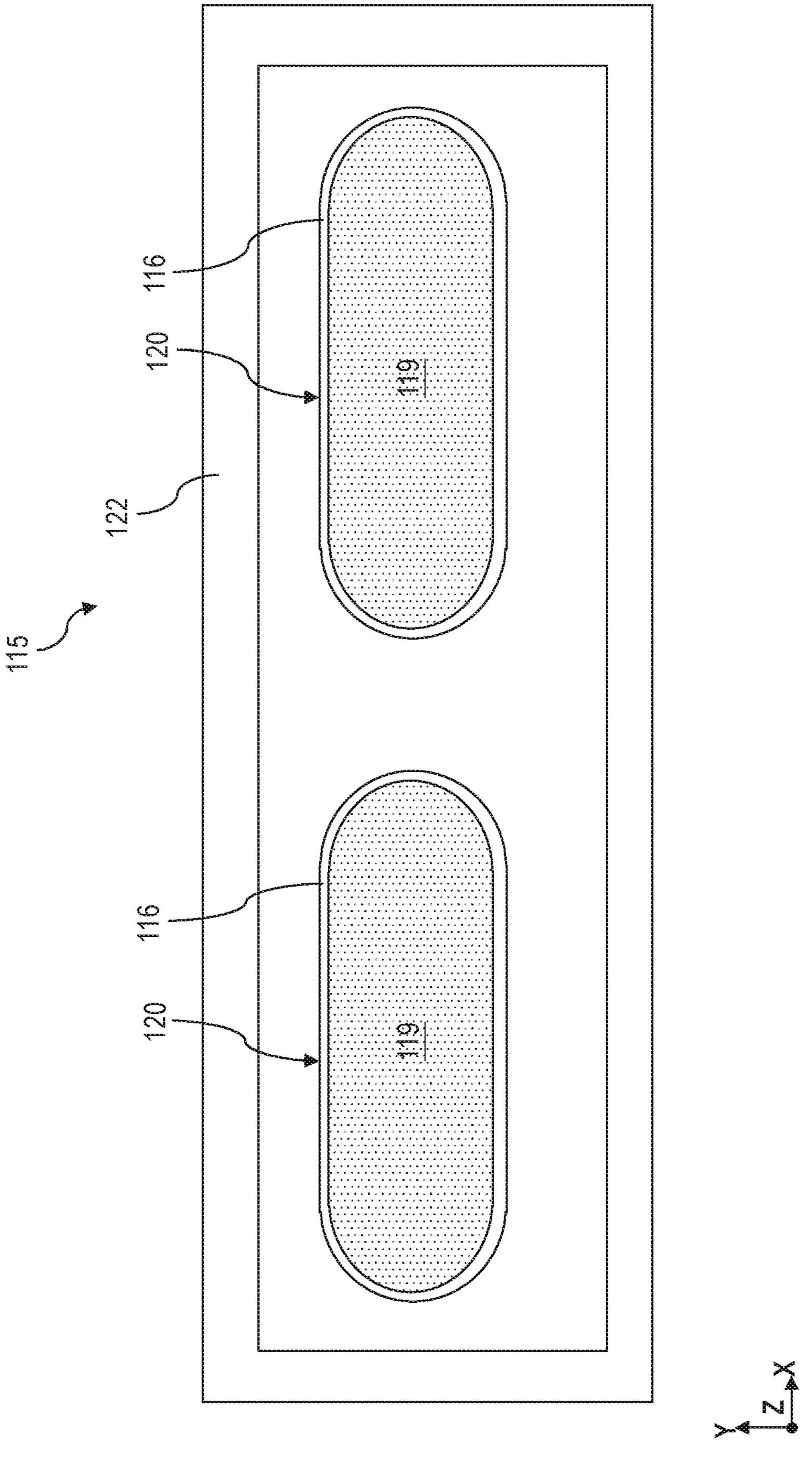
Figure 5:
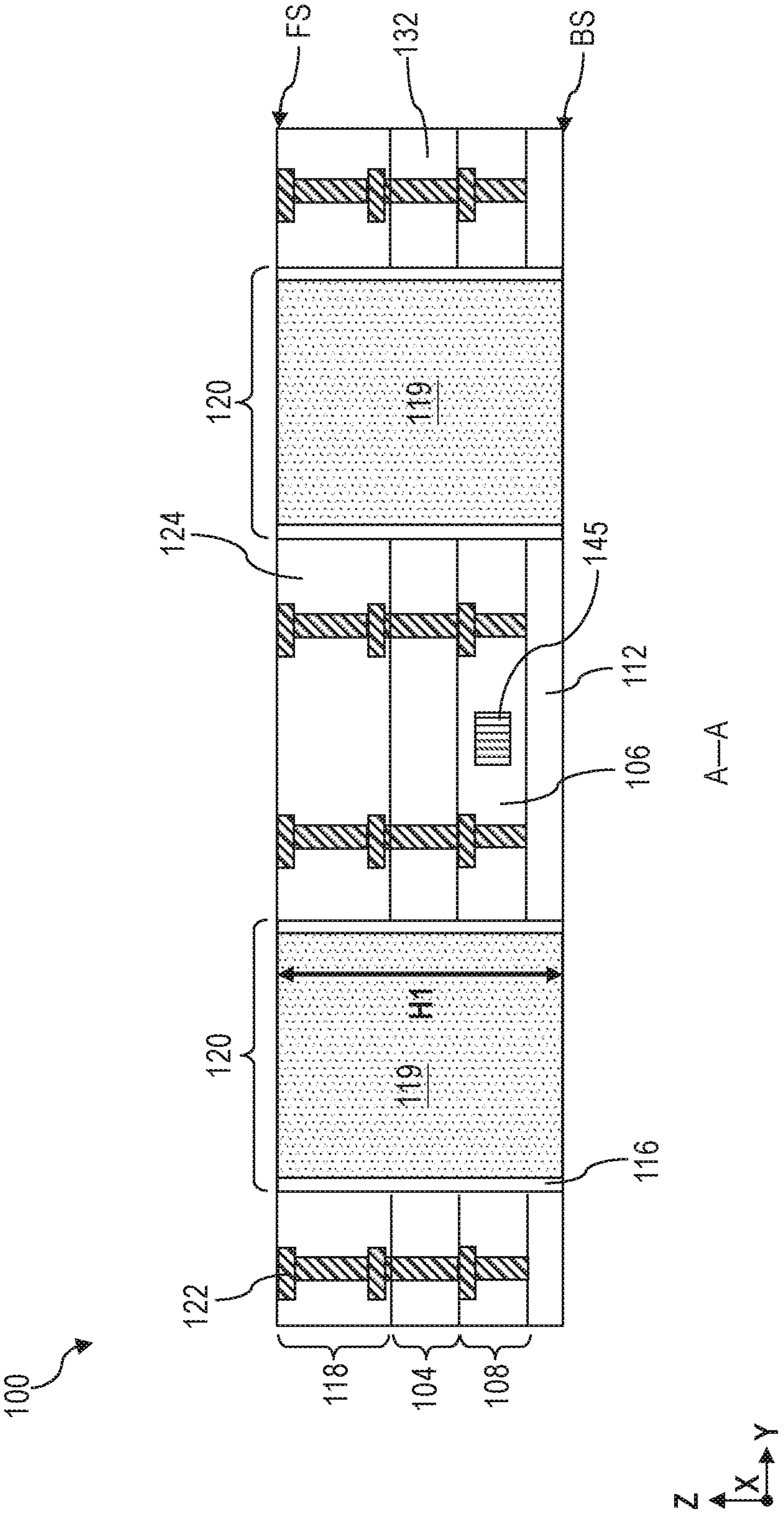
FIGS. 5 and 6 are diagrammatic cross-sectional views of a portion of the semiconductor structure of FIG. 1 along the A-A line and along the B-B line, respectively, according to alternative embodiments of the present disclosure.
Figure 6:
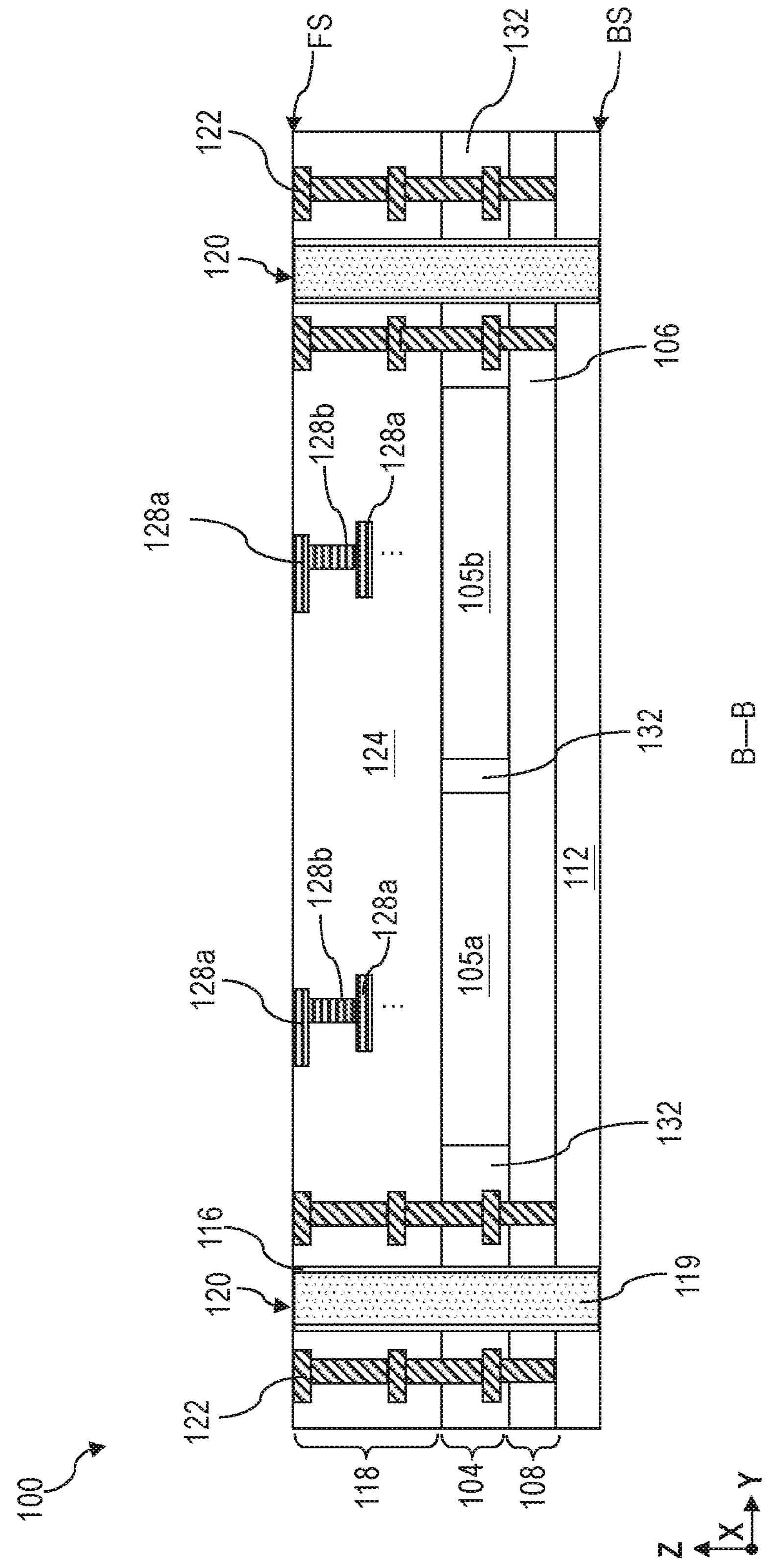
Figure 11:
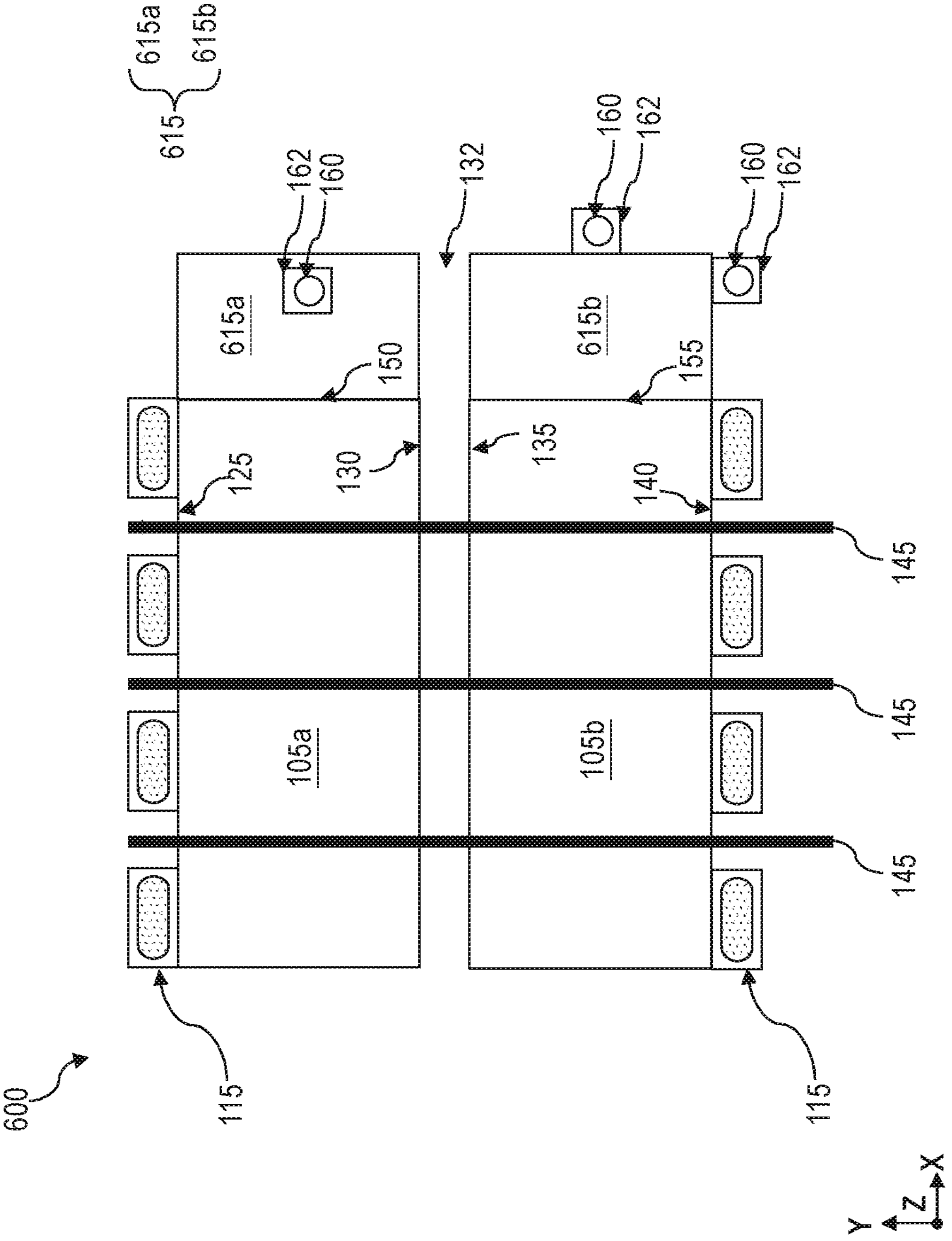
FIGS. 11, 12, and 13 are diagrammatic top views of a portion of an alternative semiconductor structure according to various aspects of the present disclosure.
Figure 12:
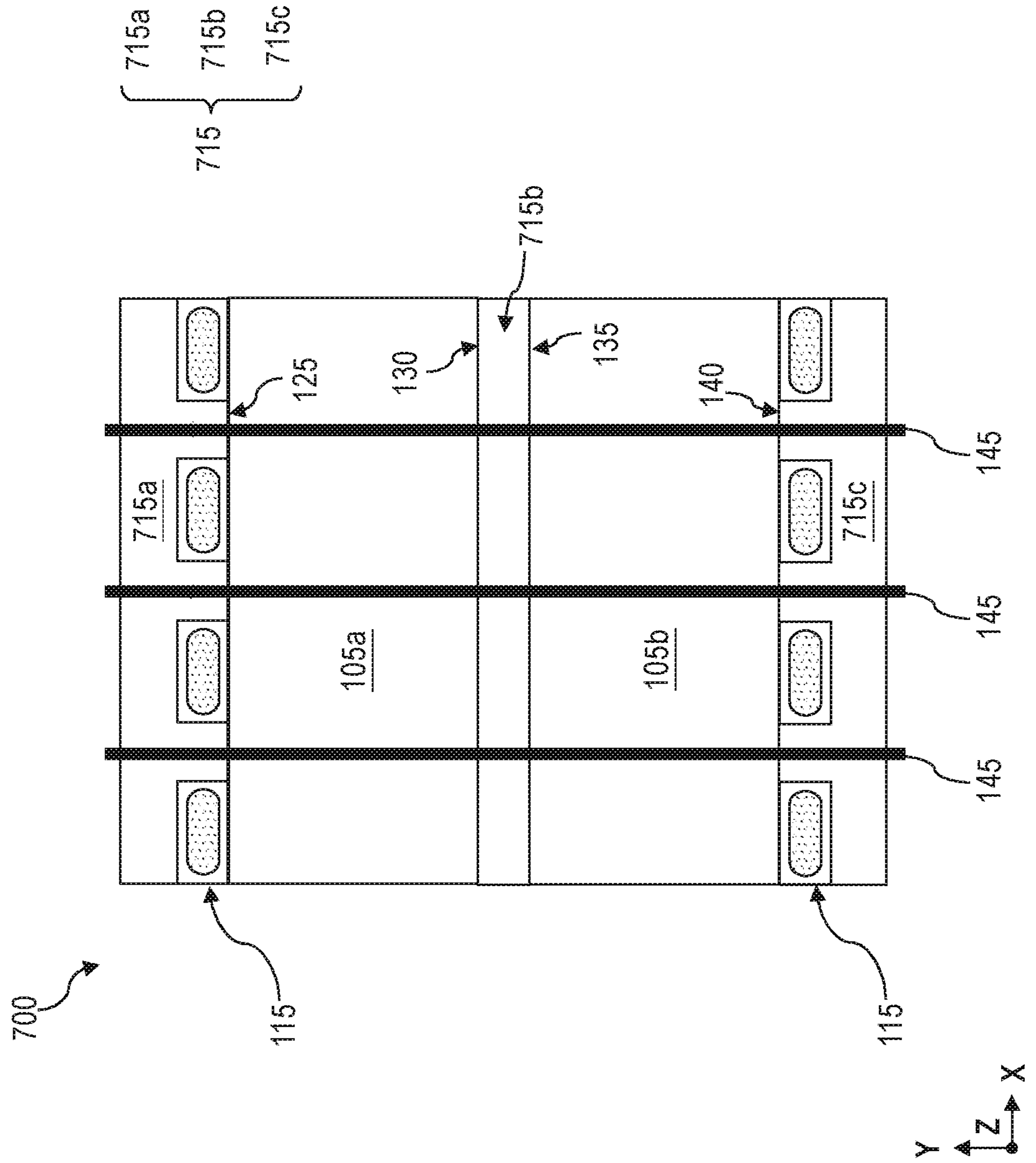
Figure 13:
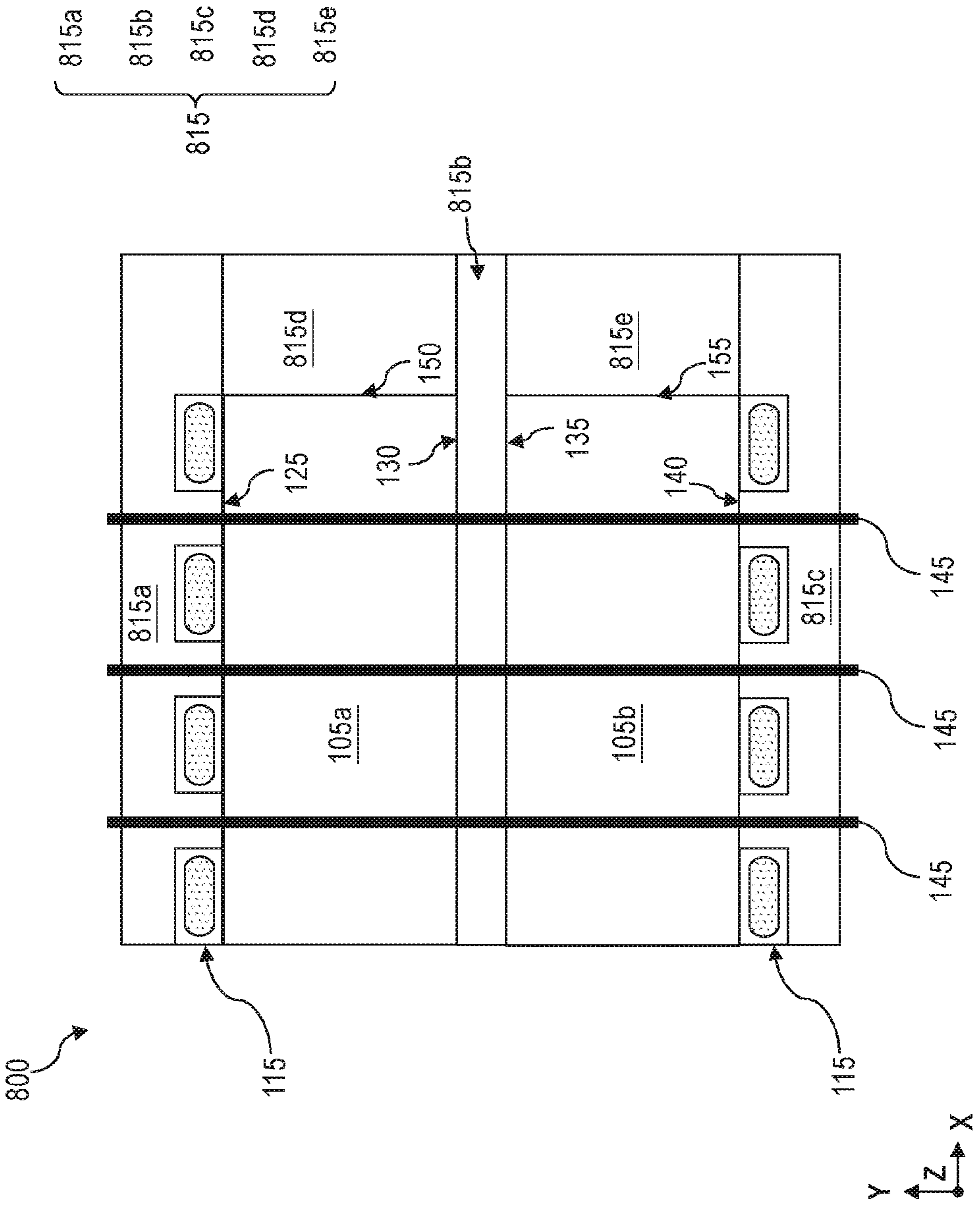

The various aspects of the present disclosure will now be described in more detail with reference to the figures. In that regard, FIG. 1 is a diagrammatic top view of a portion of a semiconductor structure 100 according to various aspects of the present disclosure. FIGS. 2 and 3 are diagrammatic cross-sectional views of the semiconductor structure 100 of FIG. 1 along an A-A line and along a B-B line, respectively, according to various aspects of the present disclosure. FIGS. 4A-4D are diagrammatic top views of a through via structure 115 of FIGS. 1, according to various aspects of the present disclosure. FIGS. 5 and 6 are diagrammatic cross-sectional views of the semiconductor structure 100 of FIG. 1 along the A-A line and along the B-B line, respectively, according to alternative embodiments of the present disclosure. FIGS. 7-10 are diagrammatic cross-sectional views of the semiconductor structure 100 of FIG. 1 along the B-B line, when the semiconductor structure is connected with one or more dies in a package, according to various aspects of the present disclosure. FIGS. 11, 12, and 13 are diagrammatic top views of a portion of alternative semiconductor structures 600, 700, and 800, respectively, according to various aspects of the present disclosure. For avoidance of doubts, the X, Y and Z directions in FIGS. 1-13 are perpendicular to one another. Throughout the present disclosure, unless expressly otherwise described, like reference numerals denote like features.

The semiconductor structure 100 shown in the figures of the present disclosure is simplified and not all features in the semiconductor structure 100 are illustrated or described in detail. The semiconductor structure 100 shown in the figures may be a portion of an IC chip, a system on chip (SoC), or portion thereof, that may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Referring to FIGS. 2-3, the semiconductor structure 100 includes a substrate 102. In an embodiment, the substrate 102 includes silicon (Si). Alternatively or additionally, the substrate 102 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 102 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 102 can include various doped regions (not shown) depending on design requirements of the semiconductor structure 100. In some implementations, the substrate 102 includes p-type doped regions (for example, p-type wells) doped with p-type dopants, such as boron (for example, $BF_2$), indium, other p-type dopant, or combinations thereof. In some implementations, the substrate 102 includes n-type doped regions (for example, n-type wells) doped with n-type dopants, such as phosphorus (P), arsenic (As), other n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or other suitable doping process can be performed to form the various doped regions.

Referring to FIGS. 1-3, the semiconductor structure 100 includes a device layer 104. The device layer 104 may be disposed over the substrate 102. The device layer 104 includes devices (e.g., transistors, resistors, capacitors, diodes, and/or inductors) and/or device components (e.g., gate structures, and/or source/drain features). In some embodiments, device layer 104 includes doped regions (e.g., source/drain features) disposed over the substrate 102. The transistors include p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) or gate-all-around (GAA) transistors. The GAA transistors may include channel regions of various shapes including nanowire, nanobar, or nanosheet, all collectively referred to as nanostructures. In some embodiments, the transistors include suspended nanostructures (channel layers) and gate structures disposed between source/drain features, where the gate structures wrap and/or surround the suspended nanostructures. Each gate structure has a metal gate structure formed from a gate electrode disposed over a gate dielectric and gate spacers disposed along sidewalls of the metal gate structure.

In some embodiments, the device layer 104 includes isolation features (not depicted) to isolate various regions, such as various device regions, of the semiconductor structure 100. In some embodiments, the device layer 104 includes dielectric layers (not depicted) such as interlayer dielectric (ILD) layers and etch stop layers (ESLs) over the devices and/or device components. The ILD layers may include dielectric materials including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Xerogel, Aerogel, amorphous fluorinated carbon, Parylene, BCB, polyimide, other low-k dielectric materials, or combinations thereof. The ESLs may include silicon nitride, silicon oxynitride, silicon nitride with oxygen or carbon elements, other suitable materials, or combinations thereof.

Still referring to FIGS. 1 and 3, the device layer 104 includes a first device region 105*a* and a second device region 105*b* adjacent to the first device region 105*a*. The first device region 105*a* and the second device region 105*b* may be individually or collectively referred to as device region(s) 105 dependent upon the context. In some embodiments, the first device region 105*a* and the second device region 105*b* each include a memory macro, which is a memory circuit including at least one array of memory cells configured to store data, and one or more circuits configured to control data input, output, and storage operations (details not depicted). In some embodiments, memory cells of the memory macro include static random-access memory (SRAM) cells. In various embodiments, the SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In various embodiments memory cells of the memory macro include dynamic random-access memory (DRAM) cells, read-only memory (ROM) cells, non-volatile memory (NVM) cells, or other memory cell types capable of storing data.

In some embodiments, referring to FIG. 1, from the top view, the semiconductor structure 100 includes a first plurality of through via structures 115 arranged along a first side 125 of the first device region 105*a* and a second plurality of through via structures 115 arranged along a second side 140 of the second device region 105*b*. For the purpose of simplicity, the through via structures 115 are also referred to as through-silicon via (TSV) structures 115 or through-substrate via (TSV) structures 115, regardless of whether a silicon or a substrate is included in the semiconductor structure 100. The TSV structures 115 are isolated from circuits (e.g., the memory macros) of the first device region 105*a* and the second device region 105*b*. The first plurality of TSV structures 115 are spaced apart from each other. The second plurality of TSV structures 115 are spaced apart from each other. The first device region 105*a* further includes a third side 130 opposite to the first side 125. The second device region 105*b* further includes a fourth side 135 opposite to the second side 140. In the depicted embodiments, the first side 125, the second side 140, the third side 130, and the fourth side 135 extend along the X direction. The third side 130 and the fourth side 135 are adjacent and have a distance D1 therebetween. D1 may be from greater than 0 μm to about 20 μm. This range is not arbitrary. If D1 is too small (e.g., 0 μm), the first device region 105*a* and the second device region 105*b* may not be sufficiently isolated from each other. If D1 is too large, it may unnecessarily increase the footprint of the IC chip and the costs associated therewith. In embodiments, by having the TSV structures 115 disclosed herein, electrical power and/or signal transmission is fulfilled by the first and the second pluralities of the TSV structures 115, thus space between the first device region 105*a* and the second device region 105*b* is free of a TSV structure. Details of the TSV structures 115 are to be described below.

In some embodiments, the device layer 104 further includes dummy regions 132 disposed between adjacent device regions 105 (e.g., the first device region 105*a* and the second device region 105*b*) and/or around the TSV structures 115. The dummy regions 132 may include dielectric materials that isolate one device region 105 (e.g., the first device region 105*a*) from another device region 105 (e.g., the second device region 105*b*). The dummy regions 132 may include dielectric layers, such as ILD layers and ESLs similar as described above. The dummy regions 132 may include dummy conductive features and/or dummy devices or dummy device components.

In some embodiments, referring to FIGS. 2 and 3, the semiconductor structure 100 includes an interconnect structure 118 (also referred to as a frontside interconnect structure 118) over the device layer 104. The interconnect structure 118 electrically couples various devices and/or components of device layer 104, such that the various devices and/or components can operate as specified by design requirements. In some embodiments, the interconnect structure 118 includes a contact layer (CO level), a via zero layer (V0 level), a metal zero (M0) level, a via one layer (V1 level), a metal one layer (M1 level), . . . , a via x layer (Vx level), and a metal x layer (Mx level). The present disclosure contemplates the interconnect structure 118 having more or less layers and/or levels, for example, a total number of x metal layers (levels) of the interconnect structure 118 with x as an integer ranging from 2 to 10. Each level of the interconnect structure 118 includes conductive features (e.g., metal lines 128*a*, metal vias 128*b*, and/or metal contacts) disposed in dielectric layers 124 (e.g., including an inter-layer dielectric (ILD) layer and an etch stop layer (ESL) similar as described above). In some embodiments, conductive features at a same level of the interconnect structure 118, such as M0 level, are formed simultaneously. In some embodiments, conductive features at a same level of the interconnect structure 118 have top surfaces that are substantially planar with one another and/or bottom surfaces that are substantially planar with one another. CO level includes source/drain contacts (MD) disposed in the dielectric layers 124; V0 level includes gate vias VG, source/drain contact vias VD, and butted contacts disposed in the dielectric layers 124; M0 level includes M0 metal lines disposed in the dielectric layers 124, where gate vias VG connect the gate structures to M0 metal lines, source/drain vias V0 connect source/drain features to M0 metal lines, and butted contacts connect gate structures and source/drain features together and to M0 metal lines; V1 level includes V1 vias disposed in the dielectric layers 124, where V1 vias connect M0 metal lines to M1 metal lines; M1 level includes M1 metal lines disposed in the dielectric layers 124; . . . ; Vx level includes Vx vias disposed in the dielectric layers 124, where Vx vias connect M (x−1) metal lines to Mx lines. FIGS. 2 and 3 have been simplified for the sake of clarity to better understand the inventive concepts of the present disclosure. Additional features can be added in the various layers of the semiconductor structure 100, and some of the features described can be replaced, modified, or eliminated in other embodiments of the semiconductor structure 100.

Referring to FIGS. 1 and 2, in embodiments, the conductive features of the interconnect structure 118 include metal lines 145. The metal lines 145 may be power lines that transmit electrical power to the semiconductor structure 100 and be referred to as power lines 145. In some embodiments, at least one of the metal lines 145 is grounded. In some embodiments, the metal lines 145 extend over the first device region 105*a* and the second device region 105*b* along the Y direction. In the depicted embodiments, each of the metal lines 145 is disposed between adjacent TSV structures 115 of the first plurality of the TSV structures 115 and is disposed between adjacent TSV structures 115 of the second plurality of the TSV structures 115.

Referring to FIGS. 1-3, in embodiments, the TSV structures 115 each include a through via 120 and a guard ring 122 surrounding the through via 120. For the purpose of simplicity, the through via 120 is also referred to as a TSV 120, regardless of whether a silicon or a substrate is included in the semiconductor structure 100. In embodiments, the TSVs 120 include TSVs 120*a* and TSVs 120*b*, which may be individually or collectively referred to as TSV(s) 120 dependent upon the context. The TSVs 120 may deliver an electrical path from a front side FS of the semiconductor structure 100 to a back side BS of the semiconductor structure 100. For example, providing an electrical path from the top side TS of the semiconductor structure 100 to and/or through the substrate 102. In some embodiments, the TSVs 120 are for transmitting input/output of electrical power and/or electrical signals. In an example, the TSVs 120*a* are for transmitting input of electrical power and/or electrical signals and the TSVs 120*b* are for transmitting output of electrical power and/or electrical signals. Referring to FIGS. 2 and 3, the TSVs 120 extend through the interconnect structure 118, the device layer 104, and the substrate 102.

In some embodiments, the TSVs 120 each include a filling layer 119 (to be described below) and a protection layer 116 horizontally contacting and surrounding the filling layer 119. In the depicted embodiments, in a same TSV structure 115, the protection layer 116 is surrounded and spaced apart from the guard ring 122 by the dielectric layers 124 and the dummy regions 132. In some other embodiments, the protection layer 116 is surrounded by and directly contacts the guard ring 122. The protection layer 116 may isolate the guard ring 122 and the filling layer 119. The protection layer 116 may include an oxide, such as silicon oxide; a nitride such as silicon nitride; an oxynitride such as silicon oxynitride; combinations thereof; and/or other suitable materials. The protection layer 116 may be a different composition than that of the dielectric layers 124 and the dielectric materials of the dummy regions 132. The protection layer 116 may be deposited by a deposition process (such as CVD, PVD, ALD, HDPCVD, MOCVD, RPCVD, PECVD, LPCVD, ALCVD, APCVD, other suitable methods, or combinations thereof).

The guard rings 122 may extend through the interconnect structure 118. In the depicted embodiment, the guard rings 122 extend through the device layer 104. In some embodiments, the guard rings 122 extend into at least a portion of the device layer 104. In some embodiments, the guard ring 122 includes a contiguous structure extending from a bottom of the dummy regions 132 of the device layer 104 to a top surface of the dielectric layers 124 of the interconnect structure 118. In some implementations, the interconnect structure 118 includes x via layers (e.g., V0, V1, V2 and so forth) and x metal layers (e.g., M0, M1, M2 and so forth). In an embodiment, the guard ring 122 includes portions/layers formed on each of the x via layers and each of the x metal layers in the interconnect structure 118, as well as portions/layers formed in the dummy regions 132. In a same TSV structure 115, the guard ring 122 may be electrically isolated from the TSV 120 but nonetheless provides a multi-layer structural and electrical barrier surrounding the TSV 120.

The term ring, as used in the guard ring 122, does necessitate a structure having an inner edge and an outer edge that are circular and thus, comprised of curvilinear lines. Rather, the guard ring 122 can be various shapes that surround the TSV 120 from the top view. FIGS. 4A-4D illustrate embodiments of the TSV structure 115 from a top view. The TSV 120 may have elongated shapes, such as rectangular shapes and racetrack shapes. In the depicted embodiment of FIG. 4A, the TSV 120 and the guard ring 122 both have rectangular shapes. Two sides 123*a* and 123*b* of each TSV 120 may extend along the X direction. The TSV 120 may have a width D2 of about 1 μm to about 10 μm along the Y direction and a length D3 of about 1 μm to about 55 μm along the X direction. The ranges of D2 and D3 are not trivial. If D2 and/or D3 are smaller than the lower bounds of the ranges, resistance of the TSV 120 may be too large, causing too much energy waste. If D2 and/or D3 are larger than upper bounds of the ranges, it may unnecessarily increase the footprint of the semiconductor structure 100 and the costs associated therewith. In the depicted embodiment of FIG. 4B, a difference from TSV structure 115 of FIG. 4A includes that the TSV 120 has a racetrack shape. The TSV 120 includes a middle portion 123 having a rectangular shape and end portions 127 having rounded shapes on two ends of the middle portion 123. Two sides 123*c* and 123*d* of the middle portion 123 may extend along the X direction. The middle portion 123 may have the width D2 along the Y direction and the length D3 along the X direction. In embodiments, the TSV 120 may have the width D2 along the Y direction and a total length D4 along the X direction. D4 may be about 1 μm to about 65 μm. This range is not arbitrary. If D4 is smaller than about 1 μm, resistance of the TSV 120 may be too large, causing too much energy waste. If D4 is larger than about 65 μm, it may unnecessarily increase the footprint of the semiconductor structure 100 and the costs associated therewith. In some embodiments, a ratio of D2 to D4 is about 1:1 to about 1:30. This range is not arbitrary. If the ratio is larger than about 1:1, the middle portion may not exist, which impact benefits of the TSV 120. If the ratio is smaller than about 1:30, it may unnecessarily increase the footprint of the semiconductor structure 100 and the costs associated therewith. The end portion 127 may be a portion of a circle (e.g., dashed circle 129) having a radius R equal to or greater than half of D2. In some embodiments, a difference between D4 and D3 is greater than 0 and equal to or less than D2. In embodiments, the periphery of the end portion 127 is an arc of the circle 129 and corresponds to a central angle P of about 45 degrees to about 180 degrees. In some embodiments as in FIG. 4C, a difference from TSV structure 115 of FIG. 4B includes that the guard ring 122 has a polygonal shape (e.g., an octagonal shape as depicted). Two parallel sides 122*a* and 122*b* of the guard ring 122 may be in parallel to the two sides 123*c* and 123*d* of the middle portion 123 of the TSV 120 and extend along the X direction. It is noted that while the TSV 120 is formed, it is not necessary that the TSV 120 be centered (e.g., share a center axis) with that of the guard ring 122 of a same TSV structure 115. The TSV 120 may be offset to one side of the guard ring 122. In the depicted embodiment as in FIG. 4D, the TSV structure 115 includes a guard ring 122 and two TSVs 120 surrounded by the guard ring 122. The two TSVs 120 may be arranged side-by-side along the X direction. In some other embodiments, the TSV structure 115 includes a guard ring 122 and more than two TSVs 120 surrounded by the guard ring 122. The more than two TSVs may be arranged along the X direction. The TSVs 120 may be similar as described above. The guard ring 122 may have a rectangular shape as depicted in FIG. 4D. In other embodiments, the guard ring 122 has other shapes, such as a polygonal shape as in FIG. 4C. By having the disclosed shapes and/or dimensions above, an area of the TSV 120 from the top view is increased, thus, to maintain a designed TSV volume, a height of the TSV 120 along the Z direction may be reduced, which may reduce a total height of the semiconductor structure 100. The TSV 120 disclosed herein may be more flexible in its height and may have a height H1 of about 2 μm to about 200 μm.

In an embodiment, formation of the TSV 120 includes patterning, etching a TSV opening, and filling the TSV opening with conductive material(s). In some embodiments, the TSV 120 is formed after the forming of the guard ring 122. The patterning process may include lithography processes and/or etching processes. For example, forming the TSV openings includes performing a lithography process to form a patterned resist layer over the dielectric layers 124 and performing an etching process to transfer a pattern defined in the patterned resist layer to the dielectric layers 124 and underlying layers (e.g., dummy regions 132 and/or the substrate 102). The lithography process can include forming a resist layer on the dielectric layers 124 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during a developing process depending on characteristics of the resist layer and characteristics of a developing solution used in the developing process. After development, the patterned resist layer includes a resist pattern that corresponds with the mask. The etching process uses the patterned resist layer as an etch mask when removing portions of the dielectric layers 124 and the underlying layers. The etching process can include a dry etching process, a wet etching process, other suitable etching process, or combinations thereof. After the etching process, the patterned resist layer is removed from the dielectric layers 124, for example, by a resist stripping process.

The TSV opening is then filled with various layers including protection layers (e.g., the protection layer 116) and the filling layer 119 (e.g., barrier layers and conductive fill material(s)). In some implementations, the barrier layers (not depicted) may include tantalum nitride (TaN), titanium nitride (TiN), tungsten nitride (WN), aluminum nitride (AlN), or combinations thereof. The conductive fill material(s) may include copper (Cu), aluminum (Al), cobalt (Co), copper alloy, tantalum (Ta), titanium (Ti), or tungsten (W). In one embodiment, the barrier layers include titanium nitride (TiN) and the conductive fill material(s) includes copper (Cu). The barrier layers may be deposited using PVD, CVD, MOCVD, ALD, or a combination thereof. Then the conductive fill material(s) is deposited using electroplating, PVD, CVD, electroless plating, or a suitable method. In one embodiment, the conductive fill material(s) is formed using electroplating. In this embodiment, after the formation of the barrier layers, a seed layer may be deposited, using PVD or a suitable process, over the semiconductor structure 100, including over surfaces of the barrier layers. Then the conductive fill material(s) may be deposited over the seed layer using electroplating. In the embodiment where electroplating is used, the seed layer may include copper (Cu), titanium (Ti), or a combination thereof and the metal fill may include copper (Cu). The seed layer may be considered part of the conductive fill material(s). After filling the TSV opening with the conductive material(s), a planarization process may remove the excess material.

In some implementations, the substrate 102 is then thinned from the backside to expose an end of the TSV 120. The thinning may include grinding and polishing the substrate 102 to expose a bottom surface of the TSV 120. Once the bottom surface of the TSV 120 is exposed, the TSV 120 extends completely through the interconnect structure 118, the device layer 104, and the substrate 102.

In some other embodiments, referring to FIGS. 5 and 6, the semiconductor structure 100 includes a backside interconnect structure 108 below the device layer 104. In some embodiments, the semiconductor structure 100 further includes a passivation layer 112 below the backside interconnect structure 108. In embodiments, the substrate 102 may be removed before forming the backside interconnect structure 108. Referring to FIGS. 1 and 5, in embodiments, the conductive features of the backside interconnect structure 108 include the power lines 145. A difference from the power lines 145 of FIG. 2 includes that, the power lines 145 of FIG. 5 extend below the first device region 105*a* and the second device region 105*b* along the Y direction. Another difference includes that the TSVs 120 of FIGS. 5 and 6 extend through the interconnect structure 118, the device layer 104, the backside interconnect structure 108, and the passivation layer 112. The guard rings 122 may extend through the interconnect structure 118, the device layer 104, and the backside interconnect structure 108.

The backside interconnect structure 108 may include a backside via zero interconnect layer (BV0 level), a backside metal zero level (BM0 level), a backside via one interconnect layer (BV1 level) and a backside metal one interconnect layer (BM1 level). Each of the BV0 level, BM0 level, BV1 level, and BM1 level may be referred to as a metal level. Metal lines formed at the BM0 level may be referred to as BM0 metal lines. Similarly, via or metal lines formed at the BV0 level, BV1 level and BM1 level may be referred to as BV0 vias, BV1 vias, and BM1 metal lines, respectively. The present disclosure contemplates backside interconnect structure 108 having more or less interconnect layers and/or levels, for example, a total number of M interconnect layers (levels) of the backside interconnect structure 108 with M as an integer ranging from 1 to 10. Each level of the backside interconnect structure 108 includes conductive features (e.g., metal lines, metal vias, and/or metal contacts, not depicted) disposed in one or more dielectric layers (e.g., including an interlayer dielectric (ILD) layer and an etch stop layer (ESL)). The dielectric layers of the backside interconnect structure 108 are collectively referred to as a dielectric structure 106. In some embodiments, conductive features at a same level of the backside interconnect structure 108, such as BM0 level, are formed simultaneously. In some embodiments, conductive features at a same level of the backside interconnect structure 108 have top surfaces that are substantially planar with one another and/or bottom surfaces that are substantially planar with one another.

In embodiments represented by FIGS. 5 and 6, the BV0 level includes vias BV0 formed under the device layer 104. For example, the vias BV0 may include one or more backside source/drain vias formed directly under the source/drain features of the device layer 104 and coupled to those source/drain features by way of a silicide layer. The vias BV0 may include one or more backside gate vias formed directly under and in direct contact with the gate structure(s) of the device layer 104. The BM0 level includes BM0 metal lines formed under the BV0 level. The backside gate vias connect gate structures to BM0 metal lines, and the backside source/drain vias connect source/drain features to BM0 metal lines. The BV1 level includes BV1 vias disposed in the dielectric structure 106, where BV1 vias connect BM0 metal lines to BM1 metal lines. The BM1 level includes BM1 metal lines formed under the BV1 level.

In some embodiments, the passivation layer 112 is formed by a suitable deposition process, such as a CVD process. The passivation layer 112 may serve to protect the device layer 104 and/or the backside interconnect structure 108, for example, from exposure to contaminant particles, moisture, oxygen, etc. The passivation layer 112 may include a dielectric layer in some embodiments. For example, the passivation layer 112 may include silicon oxide.

An interconnection can be made at the top and/or bottom of the TSVs 120 to other conductive features such as, other metal lines, bond pads, conductive bumps, other input/output features, and/or other suitable interconnections.

FIGS. 7-10 show diagrammatic cross-sectional views of the semiconductor structure 100 of FIG. 1 along the B-B line, when the semiconductor structure 100 is included in various packages. For simplicity of illustration, some features, e.g., the protection layer 116, are omitted from FIGS. 7-10.

Figure 7:
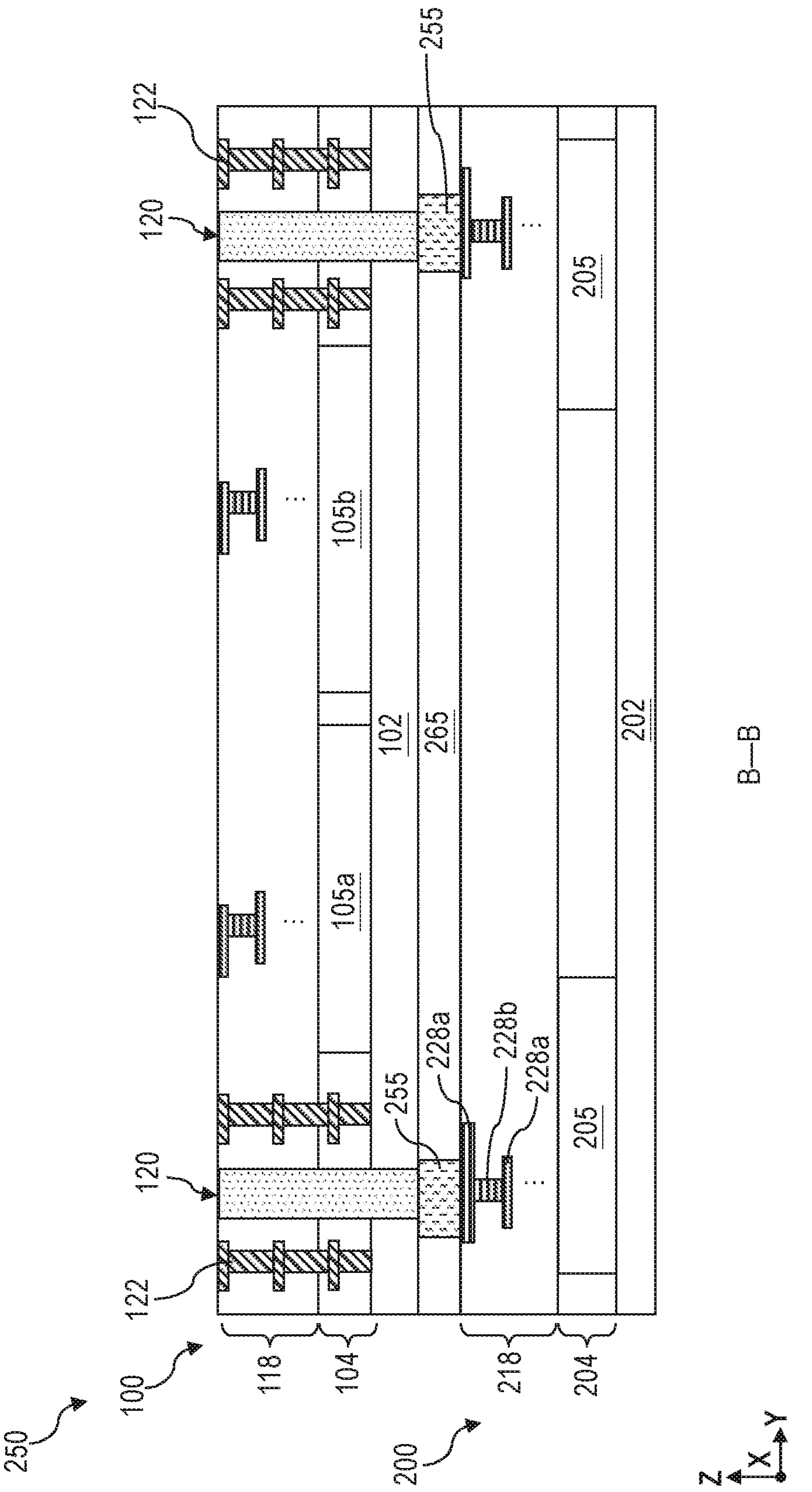
FIGS. 7, 8, 9, and 10 are diagrammatic cross-sectional views of a portion of the semiconductor structure of FIG. 1 along the B-B line, when the semiconductor structure is connected with one or more dies in a package, according to various aspects of the present disclosure.

Referring to FIG. 7, in some embodiments, a package 250 includes the semiconductor structure 100 and a die 200 disposed below the semiconductor structure 100. The die 200 may include a substrate 202, a device layer 204 including device regions 205, and an interconnect structure 218 including metal lines 228*a* and vias 228*b* similar to those described above with respect to the semiconductor structure 100. In some embodiments, the die 200 is a logic die and the device regions 205 include logic circuits. A logic die is mainly responsible for processing data, executing instructions, and making decisions. The metal lines 228*a* and vias 228*b* are electrically coupled to devices and/or device components of the device regions 205. In embodiments, the TSVs 120 are electrically coupled to topmost metal layers 228*a* of the die 200. The package 250 may include conductive features 255, which connect the TSVs 120 with the topmost metal layers 228*a*. The conductive features 255 may include bond pads, conductive bumps, and/or other suitable conductive features. The package 250 may further include a dielectric layer 265 surrounding the conductive features 255. The dielectric layer 265 may fill space between the semiconductor structure 100, the conductive features 255, and the die 200. The dielectric layer 265 may be used for protection and insulation purposes. The dielectric layer 265 supports the semiconductor structure 100 and prevents cracking of joints between the semiconductor structure 100, the conductive features 255, and the die 200. In some embodiments, the dielectric layer 265 is made of epoxy resin (amine type, phenol type, anhydrates types, etc.), silicon fillers, curing agents, additives and/or hardener materials.

Figure 8:
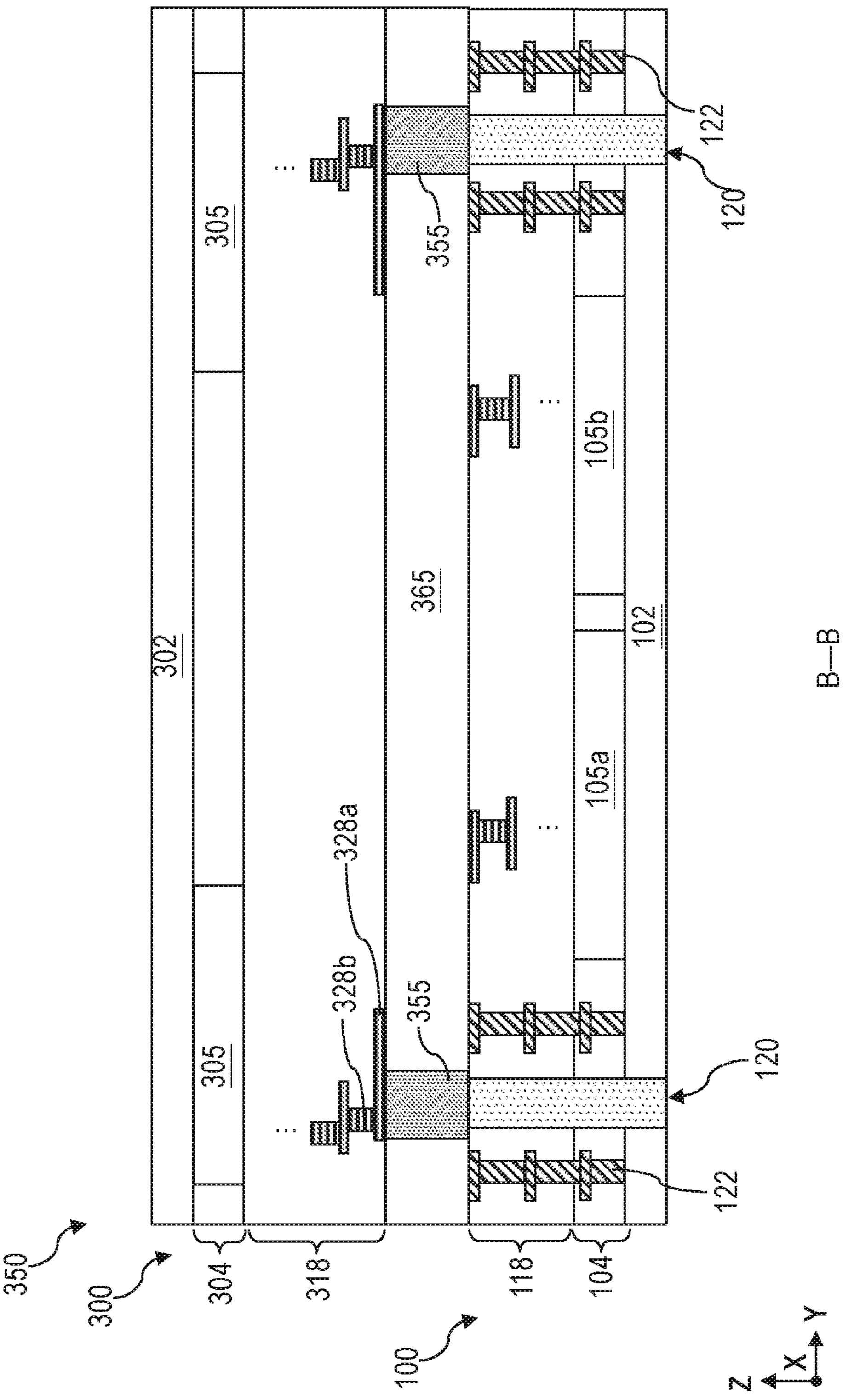

Referring to FIG. 8, in some embodiments, a package 350 includes the semiconductor structure 100 and a die 300 disposed above the semiconductor structure 100. The die 300 may have similar structures to the die 200 except that the die 300 is upside-down compared to the die 200. In embodiments, the die 300 includes a substrate 302, a device layer 304 including device regions 305, and an interconnect structure 318 including metal lines 328*a* and vias 328*b* similar to those described above. In some embodiments, the die 300 is a logic die and the device regions 305 include logic circuits. The metal lines 328*a* and vias 328*b* are electrically coupled to devices and/or device components of the device regions 305. In embodiments, the TSVs 120 are electrically coupled to bottommost metal layers 328*a* of the die 300. The package 350 may include conductive features 355, which connect the TSVs 120 with the bottommost metal layers 328*a*. The conductive features 355 may be similar to the conductive features 255 and are embedded in a dielectric layer 365 similar to the dielectric layer 265.

Figure 9:
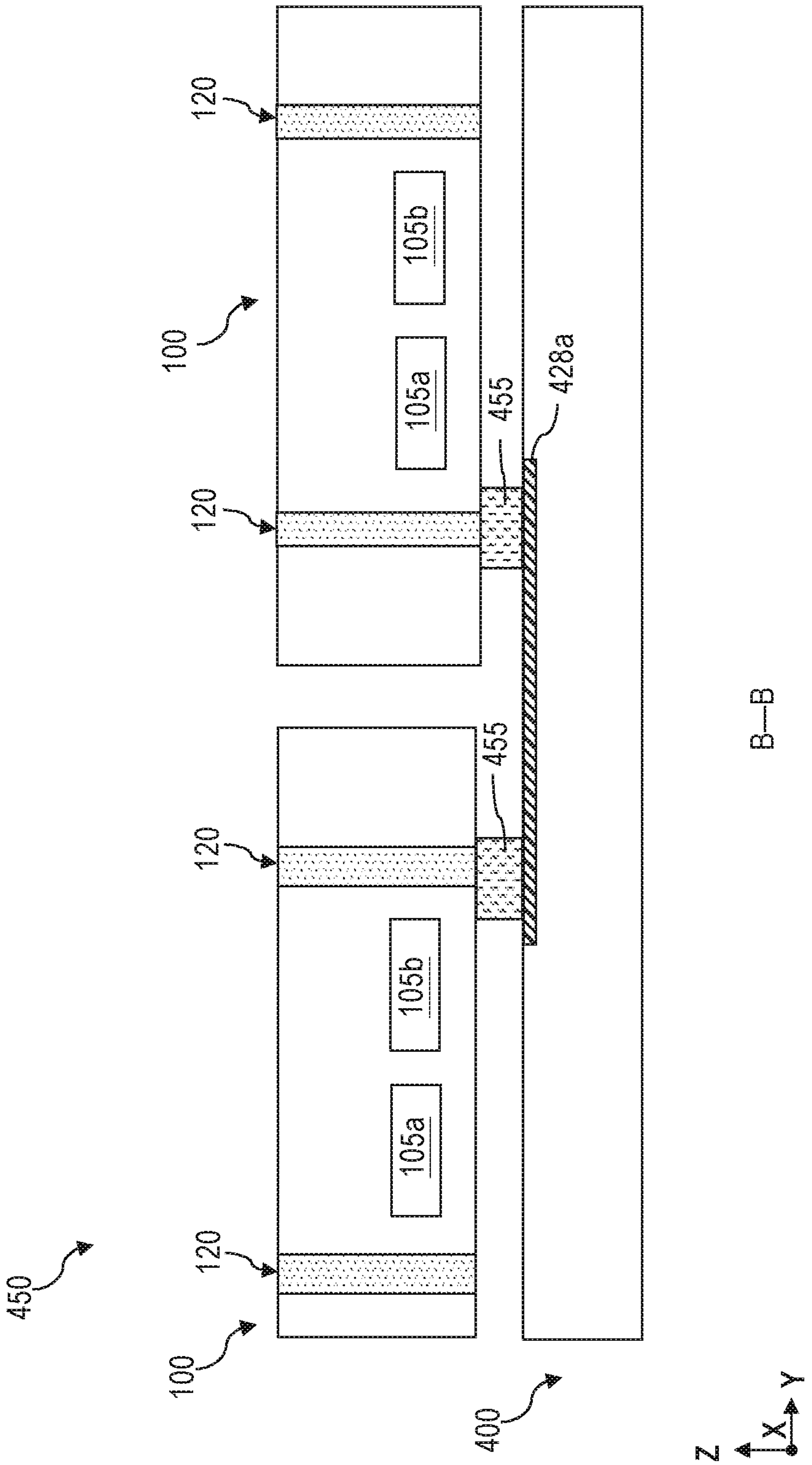

Referring to FIG. 9, in some embodiments, a package 450 includes two instances of the semiconductor structure 100 side-by-side and a die 400 disposed below the two instances of the semiconductor structure 100. For simplicity of illustration, some features, e.g., the guard rings 122, the interconnect structure 118, are omitted from FIG. 9. The two semiconductor structures 100 may be adjacent. In embodiments, the die 400 includes a metal line 428*a*. The metal line 428*a* may be a topmost metal line of the die 400. In some embodiments, a TSV 120 of each of the two semiconductor structures 100 is connected to and electrically coupled to the metal line 428*a* by a conductive feature 455. Thus, the TSV 120 of each of the two semiconductor structures 100 are electrically coupled together. In some other embodiments not depicted, the die 400 may be disposed upside-down above the two semiconductor structures 100, and the TSV 120 of each of the two semiconductor structures 100 are connected and electrically coupled together by a bottommost metal line of the die 400. The die 400 may include logic circuits or other types of circuits.

Figure 10:
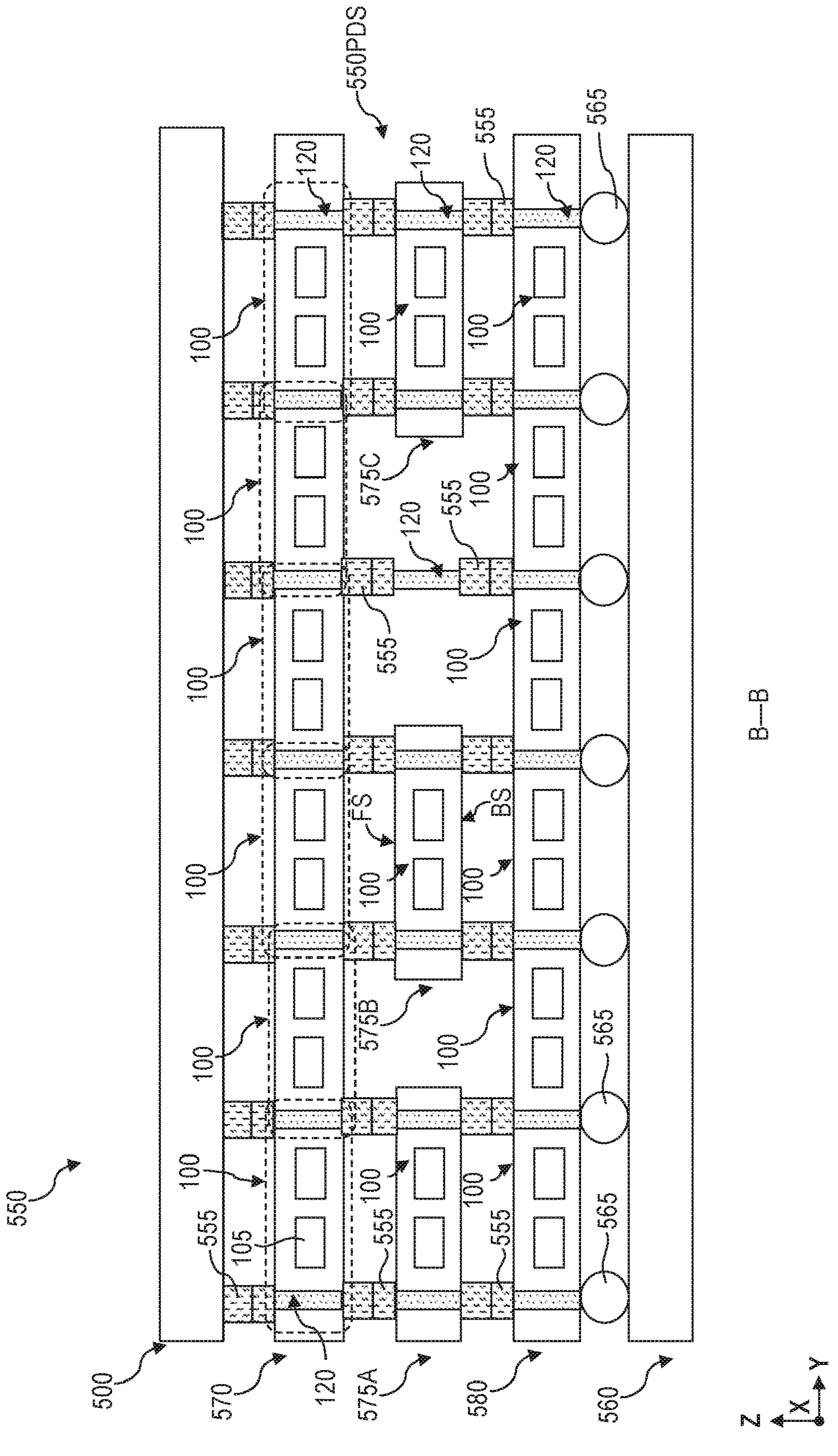

Referring to FIG. 10, in some embodiments, a package 550 is a non-limiting example of an IC package including at least one instance of the semiconductor structure 100 as discussed above with respect to FIGS. 1-6. For simplicity of illustration, some features, e.g., the guard rings 122, the interconnect structure 118, are omitted from FIG. 10.

In some embodiments, the package 550 includes a logic die 500, a substrate 560, memory dies 570, 575A-575C, and 580 disposed between the logic die 500 and the substrate 560, conductive features 555, and bump structures 565. A memory die is mainly responsible for storing and retrieving data. Each of memory dies 570, 575A-575C, and 580 includes one or more instances of the semiconductor structure 100 (e.g., in the dashed rectangles with rounded corners) including the TSVs 120 extending through the one or more instances of the semiconductor structure 100, each discussed above with respect to FIGS. 1-6. In the depicted embodiment, two adjacent semiconductor structures 100 of the memory dies 570 and 580 share a same TSV 120, which may reduce footprint of the package 550. In some other embodiments, two adjacent semiconductor structures 100 of the memory dies 570 and 580 each have its own TSVs 120 not shared by each other.

In some embodiments, the memory die 570 is adjacent to the logic die 500; the memory dies 575A-575C are aligned along the Y direction, and each of the memory dies 575A-575C is adjacent to the memory die 570; and the memory die 580 is adjacent to each of the memory dies 575A-575C and the substrate 560. A TSV 120 is disposed between the memory dies 575B and 575C and is disposed between and connecting the memory dies 570 and 580.

The logic die 500, the memory dies 570, 575A, and 580, and the substrate 560 are aligned along the Z direction; the logic die 500, the memory dies 570, 575B, and 580, and the substrate 560 are aligned along the Z direction; and the logic die 500, the memory dies 570, 575C, and 580, and the substrate 560 are aligned along the Z direction.

The logic die 500 is an IC chip including one or more IC devices, e.g., one or a combination of a logic circuit, a signal circuit, or application processor, a system on an IC (SoIC), a transmitter and/or receiver, an application-specific IC (ASIC), a large-scale integration (LSI) or very large-scale integration (VLSI) circuit, a voltage or current regulator, or the like.

The substrate 560 is an IC chip or printed circuit board (PCB) including conductive segments supported and electrically separated by a plurality of insulation layers and configured to receive one or more power supply voltages and a reference, e.g., ground, voltage, and distribute the one or more power supply voltages and reference voltage to one or more of bump structures 565.

Conductive segments include conductive lines, vias, contact pads, and/or under-bump metallization (UBM) structures including one or more conductive materials, e.g., a metal such as copper, aluminum, tungsten, or titanium, polysilicon, or another material capable of providing a low resistance path. Insulation layers include one or more dielectric materials, e.g., silicon dioxide, silicon nitride, or one or more high-k dielectric materials, molding compounds, or other materials capable of electrically insulating adjacent conductive segments from each other.

A power distribution structure 550PDS, also referred to as power distribution network 550PDS in some embodiments, includes a plurality of conductive segments supported and electrically separated by a plurality of insulation layers and arranged in accordance with power delivery requirements, e.g., of the logic die 500. In various embodiments, the power distribution structure 550PDS includes one or a combination of a TSV, e.g., TSV 120, a through-dielectric via (TDV), a power rail, a super power rail, a buried power rail, a contact pad, conductive segments arranged in a grid or mesh structure, or another arrangement suitable for distributing power to one or more IC devices. In some embodiments, the power distribution structure 550PDS includes the conductive features 555, the bump structures 565, and the TSVs 120, and is thereby configured to electrically couple the logic die 500 to the substrate 560.

In some embodiments, the plurality of conductive segments are arranged so as to contact the logic die 500 and some or all of the instances of TSV 120 included in some or all of the memory dies 570-580 such that the power distribution structure 550PDS is configured to electrically couple the logic die 500 to the substrate 560 through the some or all of the instances of TSV 120, the conductive features 555, and the bump structures 565.

The bump structures 565 are conductive structures that overlie and contact portions of substrate 560, thereby being configured to provide electrical connections between substrate 560 and some or all of the instances of TSV 120 included in the memory die 580. In some embodiments, the bump structures 565 include lead. In some embodiments, the bump structures 565 include lead-free materials such as tin, nickel, gold, silver, copper, or other materials suitable for providing electrical connections to external conductive elements. In some embodiments, the bump structures 565 have substantially spherical shapes. In some embodiments, the bump structures 565 are controlled collapse chip connection (C4) bumps, ball grid array bumps, microbumps or the like.

In the non-limiting example depicted in FIG. 10, the package 550 includes five memory dies 570-580 including 15 instances of the semiconductor structure 100, arranged in three rows disposed between the logic die 500 and the substrate 560 so as to electrically couple the logic die 500 to the substrate 560. In various embodiments, the package 550 includes greater or fewer than five memory dies 570-580 and/or includes instances of the semiconductor structure 100 otherwise arranged so as to electrically couple the logic die 500 to the substrate 560. In some embodiments, the package 550 includes a single instance of the semiconductor structure 100 disposed between the logic die 500 and the substrate 560 so as to electrically couple the logic die 500 to the substrate 560.

In the non-limiting example depicted in FIG. 10, the package 550 includes the memory dies 570-580 each oriented with a front side FS further along the Z direction than a back side BS (representative instance of memory die 575B labeled). In various embodiments, one or more of memory dies 570-580 has an opposite orientation of the back side BS further along the Z direction than the front side FS.

In the non-limiting example depicted in FIG. 10, the package 550 includes single instances of each of the logic die 500 and the substrate 560. In various embodiments, the package 550 includes two or more instances of one or both of the logic die 500 or the substrate 560, and the instances of memory dies 570-580 are arranged so as to electrically couple each instance of the logic die 500 to each instance of the substrate 560.

In the non-limiting example depicted in FIG. 10, the memory dies 570-580 include a number of instances of the semiconductor structure 100 ranging from one to six. In various embodiments, one or more of memory dies 570-580 is free from including an instance of the semiconductor structure 100 or incudes a number of instances of the semiconductor structure 100 other than six.

In the non-limiting example depicted in FIG. 10, the memory dies 570-580 include a number of instances of TSV 120 ranging from two to seven. In various embodiments, the memory dies 570-580 include a number of instances of TSV 120 other than two and seven (e.g., greater than seven).

By the configuration discussed above, the package 550 includes at least one instance of the memory dies 570-580 in which one or more instances of the TSV 120 extend through one or more instances of the semiconductor structure 100 such that the package 550 is capable of realizing the benefits discussed above with respect to the semiconductor structure 100.

FIG. 11 is a top view of a semiconductor structure 600, which is an alternative to the semiconductor structure 100. A difference from the semiconductor structure 100 includes that, in the device layer 104, the semiconductor structure 600 further includes regions 615*a* and 615*b* on a side 150 of the device region 105*a* and a side 155 of the device region 105*b*, respectively. The regions 615*a* and 615*b* each include an input/output (I/O) circuit or a control circuit for controlling the circuits (e.g., SRAM cells or SRAM macros) of the device regions 105. The regions 615*a* and 615*b* may be individually or collectively referred to as region(s) 615 or logic region(s) 615 dependent upon the context.

In some embodiments as depicted, the regions 615 include a circular TSV 160. Positions and numbers of the circular TSVs 160 illustrated herein are for examples only and do not limit the scope of the disclosure. For example, the circular TSV 160 may be inside the region 615 or on a side of the region 615. The circular TSV 160 may be surrounded by a guard ring 162 from a top view. The circular TSV 160 and the guard ring 162 may extend through similar layers (e.g., the interconnect structure 118, the device layer 104) as the TSV 120 and the guard ring 122 as described above, respectively. The circular TSV 160 may have an area smaller than an area of the TSV 120 from a top view. Thus, a resistance of the circular TSV 160 may be greater than a resistance of the TSV 120. Because the circuits (e.g., SRAM cells or SRAM macros) of the device regions 105 may be more sensitive to voltage drop than the circuits of the regions 615, using different TSVs (e.g., the TSVs 120 and the circular TSVs 160) in the device regions 105 and the regions 615 as described above may reduce wasted energy, reduce total footprint of the circuits, and reduce cost associated with the TSVs, while not impacting performance of the semiconductor structure 600.

FIG. 12 is a top view of a semiconductor structure 700, which is an alternative to the semiconductor structure 100. A difference from the semiconductor structure 100 includes that, in the device layer 104, the semiconductor structure 700 further includes regions 715*a*, 715*b*, and 715*c* on the first side 125 of the first device region 105*a*, between the third side 130 of the first device region 105*a* and the fourth side 135 of the second device region 105*b*, and on the second side 140 of the second device region 105*b*, respectively. The regions 715*a*, 715*b*, and 715*c* may each include an input/output (I/O) circuit or a control circuit for controlling the circuits (e.g., SRAM cells or SRAM macros) of the device regions 105. The regions 715*a*, 715*b*, and 715*c* may be individually or collectively referred to as region(s) 715 or logic region(s) 715 dependent upon the context. Although not depicted, the regions 715 may include the TSV(s) 160 and the guard ring(s) 162 as described above.

In some embodiments, the first plurality of the TSV structures 115 disposed along the first side 125 of the first device region 105*a* are inside the region 715*a*, and the second plurality of the TSV structures 115 disposed along the second side 140 of the second device region 105*b* are inside the region 715*c*. The TSV structures 115 are isolated from the transistors in the regions 715*a* and 715*c*. The power lines 145 may extend further over the regions 715*a*, 715*b*, and 715*c*.

FIG. 13 is a top view of a semiconductor structure 800, which is an alternative to the semiconductor structure 100. A difference from the semiconductor structure 100 includes that, in the device layer 104, the semiconductor structure 800 further includes regions 815*a*, 815*b*, 815*c*, 815*d*, and 815*e* that are comparable to the regions 715*a*, 715*b*, 715*c*, 615*a*, and 615*b* of FIGS. 11 and 12, respectively. In some embodiments, the regions 815*a*, 815*b*, and 815*c* each include a control circuit and the regions 815*d* and 815*e* each includes an I/O circuit. The regions 815*a*, 815*b*, 815*c*, 815*d*, and 815*d* may be individually or collectively referred to as region(s) 815 or logic region(s) 815 dependent upon the context. Although not depicted, the regions 815 may include the TSV(s) 160 and the guard ring(s) 162 as described above.

Although not intended to be limiting, one or more embodiments of the present disclosure provide many benefits to semiconductor structures and packages. The through vias of the semiconductor structures disclosed herein have reduced resistances by having the disclosed shapes and dimensions. Thus, wasted energy in the through vias during operations may be reduced. By implementing the through vias, space between adjacent device regions may be reduced, thus footprint of the semiconductor structure may be reduced. In addition, heights of the through vias may also be reduced, which may reduce the height of the semiconductor structure and the size of a package including the semiconductor structure. In some embodiments, the semiconductor structure disclosed herein connects to one or more dies by the through via(s) to form a package. A power distribution structure formed by the through vias and other conductive segments may have benefits as described above.

In one exemplary aspect, the present disclosure is directed to a semiconductor structure. The semiconductor structure includes a substrate and a device layer disposed over the substrate. The device layer includes a first device region and a second device region. From a top view, the first device region has a first side facing and spaced apart from a second side of the second device region. The semiconductor structure further includes an interconnect structure disposed over the first device region and the second device region, and a first plurality of through vias and a second plurality of through vias extending through the substrate, the device layer, and the interconnect structure. From the top view, the first plurality of through vias are disposed along a third side of the first device region opposite to the first side of the first device region, the second plurality of through vias are disposed along a fourth side of the second device region opposite to the second side of the second device region. Each through via of the first plurality of through vias and the second plurality of through vias has a racetrack shape from the top view.

In some embodiments, the interconnect structure includes a plurality of power lines extending along a direction perpendicular to a direction of the first side of the first device region. In some embodiments, the first device region includes a first memory array and the second device region includes a second memory array, and the first memory array and the second memory array each include static random-access memory (SRAM) cells. In some embodiments, the semiconductor structure further includes a die disposed below the substrate, wherein the die includes a top metal electrically coupled to the first plurality of through vias. In some embodiments, the die is a logic die. In some embodiments, the interconnect structure is a first interconnect structure, the semiconductor structure further including a die disposed above the first interconnect structure, the die includes a second interconnect structure electrically coupled to the first plurality of through vias. In some embodiments, the racetrack shape includes two round end portions and a rectangle middle portion between the two round end portions, a ratio of a width of the racetrack shape to a length of the racetrack shape is about 1:1 to about 1:30. In some embodiments, the racetrack shape has a total length along a direction of the first side and a width perpendicular to the direction of the first side, the total length is about 1 μm to about 65 μm, the width is about 1 μm to about 10 μm. In some embodiments, the semiconductor structure further includes a guard ring surrounding one or more through vias of the first plurality of through vias from the top view, the guard ring extends from the device layer to a top surface of the interconnect structure and includes a stack of metal lines and vias. In some embodiments, a space between the first device region and the second device region is free of a through via.

In another exemplary aspect, the present disclosure is directed to a semiconductor structure. The semiconductor structure includes a substrate and a device layer disposed over the substrate. The device layer includes a first device region and a second device region adjacent to the first device region. The semiconductor structure further includes an interconnect structure disposed over the first device region and the second device region, a first through-silicon via (TSV) and a second TSV disposed along a first side of the first device region from a top view, and a third TSV and a fourth TSV disposed along a second side of the second device region from the top view. The first TSV and the second TSV are spaced apart from the third TSV and the fourth TSV by the first device region and the second device region. The first, the second, the third, and the fourth TSVs each extend through the substrate, the device layer, and the interconnect structure. A space between the first device region and the second device region is free of a TSV. Each of the first, the second, the third, and the fourth TSVs has an elongated shape from the top view.

In some embodiments, the interconnect structure includes a power metal line extending along a direction perpendicular to a direction of the first side of the first device region from the top view, and the power metal line is disposed between the first TSV and the second TSV and between the third TSV and the fourth TSV. In some embodiments, the first device region and the second device region each include a memory array including static random-access memory (SRAM) cells. In some embodiments, at least one of the first, the second, the third, and the fourth TSVs is electrically coupled to a top metal of a logic die. In some embodiments, the logic die is disposed above the first, the second, the third, and the fourth TSVs. In some embodiments, the device layer further includes a logic region adjacent to the first device region from the top view, and the logic region includes a circular through via extending through the logic region.

In yet another exemplary aspect, the present disclosure is directed to a semiconductor structure. The semiconductor structure includes a device layer including a first device region and a second device region, an interconnect structure disposed over the first device region and the second device region, a first through-silicon via (TSV) disposed on a first side of the first device region, and a second TSV disposed on a second side of the second device region opposite from the first side of the first device region. The first TSV and the second TSV each extend through the device layer and the interconnect structure. From the top view, each of the first TSV and the second TSV has a racetrack shape including a middle portion and two rounded end portions sandwiching the middle portion. Two sides of the middle portion are parallel to the first side of the first device region.

In some embodiments, the interconnect structure includes a power metal line extending from the first device region to the second device region from a top view. In some embodiments, the interconnect structure is a first interconnect structure, the semiconductor structure further including a second interconnect structure disposed below the device layer, the first TSV and the second TSV further extend through the second interconnect structure, and the second interconnect structure includes a power metal line extending from the first device region to the second device region from a top view. In some embodiments, a space between the first device region and the second device region is free of a TSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate;

a device layer disposed over the substrate, wherein the device layer includes a first device region and a second device region, wherein from a top view, the first device region has a first side facing and spaced apart from a second side of the second device region;

an interconnect structure disposed over the first device region and the second device region; and a first plurality of through vias and a second plurality of through vias extending through the substrate, the device layer, and the interconnect structure, wherein from the top view, the first plurality of through vias are disposed along a third side of the first device region opposite to the first side of the first device region, the second plurality of through vias are disposed along a fourth side of the second device region opposite to the second side of the second device region, and wherein each through via of the first plurality of through vias and the second plurality of through vias has a racetrack shape from the top view.

2. The semiconductor structure of claim 1, wherein the interconnect structure includes a plurality of power lines extending along a direction perpendicular to a direction of the first side of the first device region.

3. The semiconductor structure of claim 1, wherein the first device region includes a first memory array and the second device region includes a second memory array, wherein the first memory array and the second memory array each include static random-access memory (SRAM) cells.

4. The semiconductor structure of claim 1, further comprising a die disposed below the substrate, wherein the die includes a top metal electrically coupled to the first plurality of through vias.

5. The semiconductor structure of claim 4, wherein the die is a logic die.

6. The semiconductor structure of claim 1, wherein the interconnect structure is a first interconnect structure, the semiconductor structure further comprising a die disposed above the first interconnect structure, wherein the die includes a second interconnect structure electrically coupled to the first plurality of through vias.

7. The semiconductor structure of claim 1, wherein the racetrack shape includes two round end portions and a rectangle middle portion between the two round end portions, wherein a ratio of a width of the racetrack shape to a length of the racetrack shape is about 1:1 to about 1:30.

8. The semiconductor structure of claim 1, wherein the racetrack shape has a total length along a direction of the first side and a width perpendicular to the direction of the first side, wherein the total length is about 1 μm to about 65 μm, wherein the width is about 1 μm to about 10 μm.

9. The semiconductor structure of claim 1, further comprising a guard ring surrounding one or more through vias of the first plurality of through vias from the top view, wherein the guard ring extends from the device layer to a top surface of the interconnect structure and includes a stack of metal lines and vias.

10. The semiconductor structure of claim 1, wherein a space between the first device region and the second device region is free of a through via.

11. A semiconductor structure, comprising:

a substrate;

a device layer disposed over the substrate, wherein the device layer includes a first device region and a second device region adjacent to the first device region;

an interconnect structure disposed over the first device region and the second device region;

a first through-silicon via (TSV) and a second TSV disposed along a first side of the first device region from a top view; and a third TSV and a fourth TSV disposed along a second side of the second device region from the top view, wherein the first TSV and the second TSV are spaced apart from the third TSV and the fourth TSV by the first device region and the second device region, wherein the first, the second, the third, and the fourth TSVs each extend through the substrate, the device layer, and the interconnect structure, wherein a space between the first device region and the second device region is free of a TSV, and wherein each of the first, the second, the third, and the fourth TSVs has an elongated shape from the top view.

12. The semiconductor structure of claim 11, wherein the interconnect structure includes a power metal line extending along a direction perpendicular to a direction of the first side of the first device region from the top view, wherein the power metal line is disposed between the first TSV and the second TSV and between the third TSV and the fourth TSV.

13. The semiconductor structure of claim 11, wherein the first device region and the second device region each include a memory array including static random-access memory (SRAM) cells.

14. The semiconductor structure of claim 11, wherein at least one of the first, the second, the third, and the fourth TSVs is electrically coupled to a top metal of a logic die.

15. The semiconductor structure of claim 14, wherein the logic die is disposed above the first, the second, the third, and the fourth TSVs.

16. The semiconductor structure of claim 11, wherein the device layer further includes a logic region adjacent to the first device region from the top view, wherein the logic region includes a circular through via extending through the logic region.

17. A semiconductor structure, comprising:

a device layer including a first device region and a second device region;

an interconnect structure disposed over the first device region and the second device region;

a first through-silicon via (TSV) disposed on a first side of the first device region; and a second TSV disposed on a second side of the second device region opposite from the first side of the first device region, wherein the first TSV and the second TSV each extend through the device layer and the interconnect structure, wherein from the top view, each of the first TSV and the second TSV has a racetrack shape including a middle portion and two rounded end portions sandwiching the middle portion, and wherein two sides of the middle portion are parallel to the first side of the first device region.

18. The semiconductor structure of claim 17, wherein the interconnect structure includes a power metal line extending from the first device region to the second device region from a top view.

19. The semiconductor structure of claim 17, wherein the interconnect structure is a first interconnect structure, the semiconductor structure further comprising a second interconnect structure disposed below the device layer, wherein the first TSV and the second TSV further extend through the second interconnect structure, and wherein the second interconnect structure includes a power metal line extending from the first device region to the second device region from a top view.

20. The semiconductor structure of claim 17, wherein a space between the first device region and the second device region is free of a TSV.

* * * * *